(12) United States Patent
Hill

(10) Patent No.: US 7,697,195 B2
(45) Date of Patent: Apr. 13, 2010

(54) APPARATUS FOR REDUCING WAVEFRONT ERRORS IN OUTPUT BEAMS OF ACOUSTO-OPTIC DEVICES

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 397 days.

(21) Appl. No.: 11/753,906

(22) Filed: May 25, 2007

(65) Prior Publication Data

US 2007/0279637 A1 Dec. 6, 2007

Related U.S. Application Data

(60) Provisional application No. 60/808,289, filed on May 25, 2006.

(51) Int. Cl.
G02F 1/33 (2006.01)
G02F 1/11 (2006.01)

(52) U.S. Cl. .................. 359/305; 359/311; 359/313; 359/285; 359/286; 372/12; 372/13; 708/815

(58) Field of Classification Search ............ 359/239, 359/240, 285, 286, 305, 307, 310–314; 372/12, 372/13, 18, 24, 27, 32, 34, 39, 66, 93, 100, 372/101; 310/313 A, 313 B, 313 C, 313 D, 310/313 R; 356/400, 484, 486, 487, 492, 356/493; 348/198, 769; 250/548
See application file for complete search history.

(56) References Cited

U.S. PATENT DOCUMENTS 3,514,534 A * 5/1970 Korpel .................... 348/198
3,760,172 A * 9/1973 Quate .................... 708/815
4,299,449 A * 11/1981 Ohta .................... 359/286
5,483,343 A 1/1996 Iwamoto et al. ........... 356/484
5,917,844 A * 6/1999 Hill ....................... 372/27
5,970,077 A * 10/1999 Hill ....................... 372/23

(Continued)

OTHER PUBLICATIONS

Pape, Dennis R., A high performance apodized phased array Bragg cell, SPIE vol. 789 Optical Technology for Microwave Applications III, pp. 116-125, 1987.

(Continued)

Primary Examiner—Loha Ben
(74) Attorney, Agent, or Firm—Fish & Richardson P.C.

(57) ABSTRACT

We disclose acousto-optic modulators that include: (a) an optical element configured to receive an input optical beam that propagates along a first direction; and (b) a transducer extending along the first direction and positioned on one or more surfaces of the optical element, the transducer having a transducer material positioned between two electrodes configured to apply a potential difference across the transducer to cause the transducer to generate an acoustic waveform propagating in a second direction in the optical element, and the input optical beam undergoing diffraction in a region of the optical element that includes the acoustic waveform. The transducer extends along a third direction orthogonal to the first and second directions, and at least one of the transducer material and the electrodes has a maximum length L along the third direction and is shaped so that the acoustic waveform has a reduced phase variation within a central region of length L of the waveform in the third direction, relative to a phase variation within a central region of length L in the third direction of an acoustic waveform generated by a rectangular transducer.

25 Claims, 13 Drawing Sheets

U.S. PATENT DOCUMENTS

| | | | |
|---|---|---|---|
| 6,157,660 A | 12/2000 | Hill | 372/27 |
| 6,236,507 B1 | 5/2001 | Hill et al. | 359/494 |
| 6,631,004 B1 * | 10/2003 | Hill et al. | 356/487 |
| 6,674,564 B2 * | 1/2004 | Vernackt et al. | 359/311 |
| 6,727,992 B2 | 4/2004 | Hill | 356/492 |
| 7,139,080 B2 * | 11/2006 | Hill et al. | 356/498 |
| 7,535,617 B2 * | 5/2009 | Gupta et al. | 359/285 |

OTHER PUBLICATIONS

Xu, Jieping and Stroud, Robert, Section 7.4 "Acoustic Wave Diffraction Loss", from book entitled "Acoustic Optic Devices", Wiley-Interscience Publication, 1992.

* cited by examiner

APPARATUS FOR REDUCING WAVEFRONT ERRORS IN OUTPUT BEAMS OF ACOUSTO-OPTIC DEVICES

CROSS-REFERENCE TO RELATED APPLICATIONS

This application claims priority to Provisional Patent Application No. 60/808,289, entitled "APPARATUS FOR REDUCING WAVEFRONT ERRORS IN OUTPUT BEAMS OF ACOUSTO-OPTIC DEVICES," filed on May 25, 2006, the entire contents of which are incorporated herein by reference.

TECHNICAL FIELD

This invention relates to acousto-optic devices and systems. For example, the invention relates to acousto-optic devices used in displacement and dispersion measuring interferometry systems.

BACKGROUND

Acousto-optic devices and systems that incorporate them can be used to modulate optical beams. For example, acousto-optic modulators can be used to diffract an optical beam, thereby modulating the spatial intensity distribution and/or phase of the optical beam. Acousto-optic devices can also be combined with additional elements in order to produce further changes in one or more properties of the optical beam, such as changes in the frequency and/or polarization state of the optical beam. For example, acousto-optic devices can be used to produce, from an input beam, two linearly and orthogonally polarized output beams having frequencies that differ from a frequency of the input beam. Methods for generating linearly and orthogonally polarized optical beams from an input beam using an acousto-optic device are disclosed, for example, in U.S. Pat. No. 6,157,660 entitled "APPARATUS FOR GENERATING LINEARLY-ORTHOGONALLY POLARIZED LIGHT BEAMS" by Henry A. Hill, and in U.S. Pat. No. 6,236,507 entitled "APPARATUS TO TRANSFORM TWO NONPARALLEL PROPAGATING OPTICAL BEAM COMPONENTS INTO TWO ORTHOGONALLY POLARIZED BEAM COMPONENTS" by Henry A. Hill and Peter de Groot, the entire contents of both of which are incorporated herein by reference.

Acousto-optic devices can be incorporated into larger measurement systems. For example, an acousto-optic device configured to produce two linearly and orthogonally polarized output beams from an input beam can be incorporated into a displacement or dispersion measuring interferometry system. In such interferometry systems, the acousto-optic device can be used, for example, to generate measurement and reference beams to perform measurement functions. Displacement measuring interferometry systems that incorporate acousto-optic devices can be used, for example, to measure angular and linear displacements of objects such as a mask stage or a wafer stage in a lithography scanner or stepper system. Dispersion measuring interferometers that incorporate acousto-optic devices can be used, for example, to determine intrinsic properties of gases.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many interferometry applications, the measurement and reference beams have orthogonal polarizations and different frequencies. The orthogonal polarizations allow a polarizing beam-splitter to direct the measurement and reference beams to the measurement and reference objects, respectively, and to combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector can be configured to measure a time-dependent intensity of the mixed beam and to generate an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is a nominal wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change corresponding to a distance change L of $\lambda/(np)$, where L is a round-trip distance change, e.g., the change in distance to and from a stage that includes the measurement object.

In dispersion measuring applications, optical path length measurements are made at multiple wavelengths, e.g., 532 nm and 1064 nm, and are used to measure dispersion of a gas in the measurement path of a distance measuring interferometer. The dispersion measurement can be used to convert the optical path length measured by the distance measuring interferometer into a physical length. Such a conversion can be important since changes in the measured optical path length can be caused by gas turbulence and/or by a change in the average density of the gas in the measurement arm of the interferometer, even though the physical distance to the measurement object is unchanged. In addition to the extrinsic dispersion measurement, the conversion of the optical path length to a physical length requires knowledge of an intrinsic value of the gas. The factor $\Gamma$ is a suitable intrinsic value and is the reciprocal dispersive power of the gas for the wavelengths used in dispersion interferometry. The factor $\Gamma$ can be measured separately or can be based on literature values.

Unfortunately, imperfections in the interferometry system can degrade the accuracy of such interferometric measurements. For example, many interferometers include non-linearities such as what are known as "cyclic errors." The cyclic errors can be expressed as contributions to the phase and/or the intensity of the measured interference signal and have a sinusoidal dependence on phase changes associated with changes in optical path length pnL and/or on phase changes associated with other parameters. In particular, there is first harmonic cyclic error in phase that has a sinusoidal dependence on $(2\pi pnL)/\lambda$ and there is second harmonic cyclic error in phase that has a sinusoidal dependence on $2(2\pi pnL)/\lambda$. Higher harmonic cyclic errors may also be present.

Other types of errors in interferometry systems include wavefront errors, which can arise, for example, from imperfections in relay optics used to transport an optical beam from a source to an interferometer, and from imperfections in interferometer and detector optics. Wavefront errors can also lead to errors in phase measurements in interferometry systems. Methods for reducing wavefront errors in interferometry systems are disclosed, for example, in U.S. Pat. No. 6,727,992 B2 entitled "METHOD AND APPARATUS TO REDUCE EFFECTS OF SHEARED WAVEFRONTS ON INTERFEROMETRIC PHASE MEASUREMENTS" by Henry A. Hill, the entire contents of which are incorporated herein by reference.

In interferometry systems that incorporate acousto-optic devices, wavefront errors can also arise from diffraction effects within the acousto-optic device. In general, acousto-optic devices can be configured to modulate an optical beam by directing the optical beam to interact with an acoustic wave in an acoustic cell. For example, an optical beam can undergo diffraction in a region of the acousto-optic cell that includes the acoustic wave. The wavefront figures of both undiffracted (i.e., zero-order) and diffracted beams can be modulated in the acousto-optic device, and the amplitude and/or phase of the modulation can be different at different transverse spatial positions within the cross-sectional profile of the optical beams.

The effect of wavefront errors will depend upon procedures used to mix components of the output beam with respect to component polarization states and to detect the mixed output beam to generate an electrical interference signal. The mixed output beam can for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of wavefront errors will also depend on properties of a beam stop should a beam stop be used in the procedure to detect the mixed output beam. Generally, the errors in the interferometric signal are compounded when an optical fiber is used to transmit the mixed output beam to the detector.

SUMMARY

In general, in a first aspect, the invention features an acousto-optic modulator that includes: (a) an optical element configured to receive an input optical beam that propagates along a first direction; and (b) a transducer extending along the first direction and positioned on one or more surfaces of the optical element, the transducer having a transducer material positioned between two electrodes configured to apply a potential difference across the transducer to cause the transducer to generate an acoustic waveform propagating in a second direction in the optical element, and the input optical beam undergoing diffraction in a region of the optical element that includes the acoustic waveform. The transducer extends along a third direction orthogonal to the first and second directions, and at least one of the transducer material and the electrodes has a maximum length L along the third direction and is shaped so that the acoustic waveform has a reduced phase variation within a central region of length L of the waveform in the third direction, relative to a phase variation within a central region of length L in the third direction of an acoustic waveform generated by a rectangular transducer.

Embodiments of the acousto-optic modulator can include any of the following features.

The optical element can include an optically birefringent material. Alternatively, or in addition, the optical element can include an optically isotropic material.

The transducer material can be a piezoelectric material.

A shape of at least one of the electrodes can be different from a shape of the transducer material. At least one of the electrodes can include at least one material selected from the group consisting of silver, copper, aluminum, and chromium.

The optical element can be a prism.

A phase variation of the acoustic waveform within a central region of length L of the waveform along the third direction in an acoustic near-field region of the optical element can be less than about 0.005 radians, e.g., less than about 0.003 radians.

A difference between the phase variation within a central region of length L of the acoustic waveform along the third direction, and the phase variation within a central region of length L along the third direction of the acoustic waveform generated by the rectangular transducer, can be at least about 0.005 radians, e.g., at least about 0.01 radians, at least about 0.04 radians.

The transducer can include a plurality of sub-portions. At least some of the plurality of sub-portions can have the same shape. At least some of the plurality of sub-portions have a rectangular shape, and/or a trapezoidal shape, and/or a triangular shape. At least some of the plurality of sub-portions can have two pairs of two parallel sides.

The input optical beam can propagate through an acoustic near-field region of the optical element. An intermediate beam can be produced from the diffraction of the input optical beam within the optical element. The intermediate beam can include two beam components having different frequencies. The frequency of one of the intermediate beam components can be the same as the frequency of the input optical beam.

The acousto-optic modulator can further include a second transducer extending along the first direction and positioned on one or more surfaces of the optical element, the second transducer having a second transducer material positioned between a second two electrodes configured to apply a potential difference across the second transducer to cause the second transducer to generate a second acoustic waveform propagating in a fourth direction in the optical element, and the intermediate beam undergoing diffraction in a region of the optical element that includes the second acoustic waveform. The second transducer can extend along the third direction, and at least one of the second transducer material and the second two electrodes can have a maximum length M along the third direction and can be shaped so that the second acoustic waveform has a reduced phase variation within a central region of length M of the second acoustic waveform in the third direction, relative to a phase variation in a central region of length M in the third direction of an acoustic waveform generated by a rectangular transducer. The second and fourth directions can be parallel. Alternatively, or in addition, the fourth direction can lie in a plane formed by the first and second directions.

A second intermediate beam can be produced from the diffraction of the intermediate beam within the optical element. The second intermediate beam can include two beam components having different frequencies. Each of the frequencies of the two beam components of the second intermediate beam can be different from the frequency of the input optical beam.

The acousto-optic modulator can further include one or more elements for adjusting a polarization state of each of the intermediate beam components. The one or more elements can be optically birefringent. The input optical beam can have a wavelength $\lambda$, and the one or more elements can include at least one element that is a half waveplate at $\lambda$. Alternatively, or in addition, the one or more elements can include at least one element that is a quarter waveplate at $\lambda$. The one or more elements can be positioned to receive the intermediate beam and to produce an output beam that includes two linearly and orthogonally polarized beam components having different frequencies.

In another aspect, the invention features an acousto-optic modulator that includes: (a) an optical element configured to receive an input optical beam that propagates along a first direction; and (b) a transducer extending along the first direction and positioned on one or more surfaces of the optical element, the transducer having a transducer material positioned between two electrodes configured to apply a potential difference across the transducer to cause the transducer to generate an acoustic waveform propagating in a second direction in the optical element, and the input optical beam undergoing diffraction in a region of the optical element that includes the acoustic waveform. The transducer can extend along a third direction orthogonal to the first and second directions, and at least one of the transducer material and the electrodes can have a maximum length L along the third direction and can be shaped so that a phase variation of the acoustic waveform within a central region of length L of the waveform along the third direction is less than about 0.005 radians.

Embodiments of the acousto-optic modulator can have any of the following features.

A phase variation of the acoustic waveform within a central region of length L of the waveform along the third direction can be less than about 0.003 radians.

The transducer can include a plurality of sub-portions. Each of the plurality of sub-portions can have the same shape. Alternatively, or in addition, at least some of the plurality of sub-portions can have two pairs of two parallel sides.

The input optical beam can propagate through the acoustic near-field region of the optical element.

An intermediate beam can be produced from the diffraction of the input optical beam within the optical element. The intermediate beam can include two beam components having different frequencies. The frequency of one of the intermediate beam components can be the same as the frequency of the input optical beam.

The acousto-optic modulator can further include one or more elements for adjusting a polarization state of each of the intermediate beam components. The one or more elements can be optically birefringent. The input optical beam can have a wavelength $\lambda$, and the one or more elements can include at least one element that is a half waveplate at $\lambda$. Alternatively, or in addition, the one or more elements can include at least one element that is a quarter waveplate at $\lambda$. The one or more elements can be positioned to receive the intermediate beam and to produce an output beam that includes two linearly and orthogonally polarized beam components having different frequencies.

In another aspect, the invention features an acousto-optic modulator that includes: (a) an optical element configured to receive an input optical beam that propagates along a first direction; and (b) a transducer extending along the first direction and positioned on one or more surfaces of the optical element, the transducer having a transducer material positioned between two electrodes configured to apply a potential difference across the transducer to cause the transducer to generate an acoustic waveform propagating in a second direction in the optical element, and the input optical beam undergoing diffraction in a region of the optical element that includes the acoustic waveform. The transducer extends along a third direction orthogonal to the first and second directions, and has a plurality of sub-portions, where each of the sub-portions includes two edges parallel to the third direction and extending along the entire length of the transducer, and a center of mass. A position of the center of mass of each of the sub-portions along the first direction is different, and the position of the center of mass of each of the sub-portions along the third direction varies among the sub-portions.

Embodiments of the acousto-optic modulator can include any of the following features.

At least one of the transducer material and the electrodes can have a maximum length L along the third direction, and a phase variation of the acoustic waveform within a central region of length L of the waveform along the third direction can be less than about 0.005 radians, e.g., less than about 0.003 radians.

At least some of the plurality of sub-portions can have the same shape. At least some of the plurality of sub-portions can have two pairs of two parallel sides. At least some of the plurality of sub-portions can have a rectangular shape, and/or a trapezoidal shape, and/or a triangular shape.

The positions of the centers of mass of each of the sub-portions can vary monotonically along the third direction. Alternatively, the positions of the centers of mass of each of the sub-portions can vary non-monotonically along the third direction.

At least one of the transducer material and the electrodes can have a maximum length L along the third direction, and the variation of the positions of the centers of mass of each of the sub-portions along the third direction can generate an acoustic waveform having a reduced phase variation within a central region of length L of the waveform in the third direction, relative to a phase variation in a central region of length L in the third direction of an acoustic waveform generated by a rectangular transducer.

The input optical beam can propagates through an acoustic near-field region of the optical element.

An intermediate beam can be produced from the diffraction of the input optical beam within the optical element. The intermediate beam can include two beam components having different frequencies. The frequency of one of the intermediate beam components can be the same as the frequency of the input optical beam.

The acousto-optic modulator can further include one or more elements for adjusting a polarization state of each of the intermediate beam components. The one or more elements can be optically birefringent. The input optical beam can have a wavelength $\lambda$, and the one or more elements can include at least one element that is a half waveplate at $\lambda$. Alternatively, or in addition, the one or more elements can include at least one element that is a quarter waveplate at $\lambda$. The one or more elements can be positioned to receive the intermediate beam and to produce an output beam that includes two linearly and orthogonally polarized beam components having different frequencies.

In another aspect, the invention features a system that includes any of the acousto-optic modulators disclosed above, a source configured to provide the input optical beam, and an interferometry system configured to receive the output beam.

Embodiments of the system can include any of the following features.

The source can be a laser system.

The interferometry system can be configured to monitor a position of a measurement object, where the interferometry system includes an interferometer configured to direct a measurement beam to reflect from the measurement object and to combine the reflected measurement beam with a reference beam to form a signal beam.

The system can further include a detector configured to detect the signal beam and an electronic processor configured to derive information about the position of the measurement object from a phase variation in the signal beam that arises from a phase difference between the measurement and reference beams.

A first one of the output beam components can form the measurement beam and a second one of the output beam components can form the reference beam.

In another aspect, the invention features a lithography system for use in fabricating integrated circuits on a wafer, where the lithography system includes: (a) a stage for supporting the wafer; (b) an illumination system for imaging spatially patterned radiation onto the wafer; (c) a positioning system for adjusting the position of the stage relative to the imaged radiation; and (d) any of the systems disclosed above, where the interferometry system is configured to monitor the position of the wafer relative to the imaged radiation.

Embodiments of the lithography system can include any suitable features disclosed above.

In another aspect, the invention features a lithography system for use in fabricating integrated circuits on a wafer, where the lithography system includes a stage for supporting the wafer, and an illumination system including a radiation source, a mask, a positioning system, a lens assembly, and any of the systems disclosed above. During operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

Embodiments of the lithography system can include any suitable features disclosed above.

In another aspect, the invention features a beam writing system for use in fabricating a lithography mask, where the beam writing system includes: (a) a source providing a write beam to pattern a substrate; (b) a stage supporting the substrate; (c) a beam directing assembly for delivering the write beam to the substrate; (d) a positioning system for positioning the stage and beam directing assembly relative one another; and (e) any of the systems disclosed above, where the interferometry system is configured to monitor the position of the stage relative to the beam directing assembly.

Embodiments of the beam writing system can include any suitable features disclosed above.

In another aspect, the invention features a lithography method for use in fabricating integrated circuits on a wafer, where the method includes: (a) supporting the wafer on a moveable stage; (b) imaging spatially patterned radiation onto the wafer; (c) adjusting the position of the stage; and (d) monitoring the position of the stage using any of the systems disclosed above.

Embodiments of the lithography method can include any suitable features disclosed above.

In another aspect, the invention features a lithography method for use in the fabrication of integrated circuits, where the method includes: (a) directing input radiation through a mask to produce spatially patterned radiation; (b) positioning the mask relative to the input radiation; (c) monitoring the position of the mask relative to the input radiation using any of the systems disclosed above; and (d) imaging the spatially patterned radiation onto a wafer.

Embodiments of the lithography method can include any suitable features disclosed above.

In another aspect, the invention features a lithography method for fabricating integrated circuits on a wafer, where the method includes: (a) positioning a first component of a lithography system relative to a second component of a lithography system to expose the wafer to spatially patterned radiation; and (b) monitoring the position of the first component relative to the second component using any of the systems disclosed above.

Embodiments of the lithography method can include any suitable features disclosed above.

In another aspect, the invention features a method for fabricating integrated circuits, where the method includes any of the lithography methods disclosed above.

Embodiments of the method for fabricating integrated circuits can include any suitable features disclosed above.

In another aspect, the invention features a method for fabricating integrated circuits, where the method includes using any of the lithography systems disclosed above.

Embodiments of the method for fabricating integrated circuits can include any suitable features disclosed above.

In another aspect, the invention features a method for fabricating a lithography mask, where the method includes: (a) directing a write beam to a substrate to pattern the substrate; (b) positioning the substrate relative to the write beam; and (c) monitoring the position of the substrate relative to the write beam using any of the systems disclosed above.

Embodiments of the method for fabricating a lithography mask can include any suitable features disclosed above.

Unless otherwise defined, all technical and scientific terms used herein have the same meaning as commonly understood by one of ordinary skill in the art to which this invention belongs. Where conflict exists between documents incorporated by reference and the current specification, the current specification will control.

The details of one or more embodiments of the invention are set forth in the accompanying drawings and the description below. Other features and advantages of the invention will be apparent from the description, drawings, and claims.

DESCRIPTION OF DRAWINGS

Like reference symbols in the various drawings indicate like elements.

DETAILED DESCRIPTION

Figure 1:
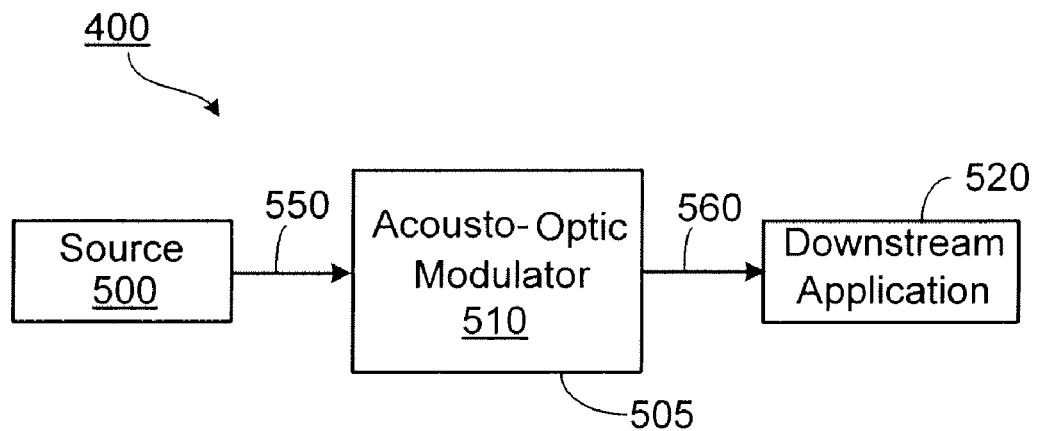
FIG. 1 is a schematic diagram of a system for modulating an optical beam using an acousto-optic modulator.

Heterodyne displacement and dispersion measuring interferometry systems measure relative changes in the optical path lengths of reference and measurement arms of an interferometer. In many systems, a reference optical beam is provided to the interferometry system from an optical system. The reference optical beam propagates through a reference arm of the interferometer, reflecting from a reference object. A measurement optical beam is also provided to the interferometry system from the optical system, and the measurement optical beam propagates through a measurement arm of the interferometer, reflecting from a measurement object. The reference and measurement optical beams are combined at a detector to generate an interference signal. If the position of the measurement object changes, the optical path length of the measurement arm can change relative to the optical path length of the reference arm, and the interference signal measured by the detector also therefore can change. The interference signal can be used to measure such relative changes in the optical path lengths of the reference and measurement arms of the interferometer.

In heterodyne interferometry systems, the reference and measurement optical beams have different optical frequencies $f_r$ and $f_m$, respectively. By combining the reference and measurement beams at a detector, the interference signal generated includes a beat component at a difference frequency $|f_r-f_m|$ between the two optical frequencies. In many heterodyne interferometry systems, the reference and measurement beams are also linearly and orthogonally polarized with respect to one another. Various types of optical systems can be used to provide linearly and orthogonally polarized optical beams having a heterodyne frequency splitting to an interferometer system.

In particular, one type of optical system includes a source (e.g., a laser, one or more light-emitting diodes, or another radiation emitting source) and an acousto-optic modulator. The source is configured to provide an optical beam to the acousto-optic modulator. In many embodiments, the optical beam has a relatively narrow linewidth (e.g., less than about 0.5 nm) and a central frequency. The optical beam can also be linearly polarized. In certain embodiments, the source can be frequency stabilized (e.g., a frequency stabilized He—Ne longitudinal Zeeman laser, or a frequency stabilized semiconductor laser).

The optical beam from the source enters the acousto-optic modulator, which includes one or more transducers. Actuation of the transducers by supplying electrical energy to the modulator produces acoustic waves in the acousto-optic modulator. The optical beam propagates through regions of the modulator that include the acoustic waves, and can undergo small-angle Bragg diffraction in those regions. Due to photoelastic interactions with the acoustic waves, the diffracted optical beam can emerge shifted in frequency by a small amount. In certain embodiments, two optical beams can be generated as a result of the diffraction, the two beams being elliptically polarized with major elliptical axes oriented orthogonally with respect to one another. One of the beams can be frequency shifted, for example, while the other beam is not shifted in frequency.

Some embodiments can include multiple transducers configured to produce multiple acoustic waves, so that the optical beams are diffracted multiple times within the acousto-optic modulator. As a result, multiple beams can emerge from the acousto-optic modulator, each having a frequency different from the central frequency of the source optical beam. Optical elements such as birefringent plates and prisms can be used to produce pairs of linearly and orthogonally polarized beams having heterodyne frequency splittings which can then be directed to heterodyne interferometry systems to perform measurement functions.

Within an acousto-optic modulator, diffracted optical beams can acquire optical amplitude and/or phase modulations as a result of the interaction with the acoustic waves. In general, the spatial cross-section of the optical beams is smaller than the spatial cross-section of the acoustic waves, and to a first approximation, the phase profile of the acoustic wave in the region of the modulator sampled by the optical beam is transferred to the optical phase profile of the beam. Spurious phase modulations of the optical beam can produce wavefront errors in heterodyne interferometry systems, the wavefront errors leading to measurement errors that can limit the accuracy of measurements obtained from the interferometry systems.

To reduce such measurement errors in interferometry systems, acoustic waves in acousto-optic modulators can be configured to have selected amplitude and/or phase properties. Control over the amplitude and/or phase profile of acoustic waves can be achieved by appropriate configuration of the transducers and/or electrodes that produce the acoustic waves. FIG. 1 is a schematic diagram of an acousto-optic system for modulating an optical beam, wherein amplitude and phase profiles of acoustic waves in an acousto-optic modulator are controlled. The system 400 includes a source 500 that provides an optical beam 550 incident on an entry surface of an acousto-optic modulator 510. Optical beam 550 emerges from acousto-optic modulator 510 as modulated beam 560, which is directed to downstream application 520. Source 500 can be any source of one or more optical beams, such as, for example, a laser (e.g., a helium-neon laser, a solid-state laser), one or more light-emitting diodes, one or more incandescent sources or fluorescent sources, or other types of sources. Optical beam 550 provided by source 500 can have a central wavelength in the visible region of the electromagnetic spectrum, for example. Alternatively, the central wavelength of optical beam 550 can be in the ultraviolet region, infrared region, or another region of the electromagnetic spectrum. Optical beam 550 can be linearly polarized, or can have another polarization state (e.g., circular, elliptical), and can include two polarization components. Source 500 can include, in addition, optical elements that can be used to change the polarization state of optical beam 550, such as birefringent waveplates.

Acousto-optic modulator 510 is configured to modulate the amplitude and/or the phase of optical beam 550, which is incident on an entry face 505 of modulator 510. In certain embodiments, acousto-optic modulator 510 is formed from an optically birefringent material. In other embodiments, modulator 510 is not optically birefringent, e.g., modulator 510 is formed from a material that is optically isotropic.

Accordingly, in some embodiments, acousto-optic modulator 510 can include, for example, an optical substrate material such as a crystalline material that is optically birefringent. Examples of suitable birefringent materials include crystalline materials such as quartz, calcite, lithium niobate, tellurium dioxide, and other optically non-isotropic materials. Birefringent materials in acousto-optic modulator 510 can be uniaxial or biaxial materials.

In certain embodiments, acousto-optic modulator 510 can include non-birefringent optical substrate materials such as amorphous, optically isotropic materials, e.g., optical glasses such as BK7 glass, silica glasses, SF-x glasses, and other isotropic materials.

Acousto-optic modulator 510 also includes at least one transducer, such as a piezoelectric transducer, configured to generate one or more acoustic waves in the optical substrate material. In general, a generated acoustic wave can be disposed within a portion of the optical substrate, and the portion of the substrate that includes the acoustic wave can change as a function of time (e.g., as the acoustic wave propagates within the optical substrate material) or may be constant in time. A potential difference can be applied across a transducer by connecting a power supply to its electrodes. The potential difference can cause the transducer to expand or contract, launching acoustic waves into the optical substrate material of acousto-optic modulator 510. In certain embodiments, the amplitude of the applied potential difference can be varied periodically in time to produce an acoustic waveform that includes multiple acoustic cycles in the optical substrate material.

Optical beam 550 is directed to pass through the portion of the optical substrate that includes the acoustic wave. On passing through that portion of the substrate, the amplitude or phase or both the amplitude and phase of optical beam 550 can be modulated to produce modulated beam 560. Other properties of optical beam 550 can also be changed. For example, the central wavelength of optical beam 550 can be changed. Alternatively, or in addition, two or more spatially separated beams having the same or different polarizations, amplitudes, phases and/or central wavelengths can be produced.

Downstream application 520 receives one or more optical beams produced in acousto-optic modulator 510. The beams can be used in downstream application 520 to perform various measurement and other functions. For example, in some embodiments, downstream application 520 can include a heterodyne displacement or dispersion measuring interferometer configured to receive modulated beam 560, wherein modulated beam 560 includes two linearly and orthogonally polarized optical beam components with different frequencies, produced from optical beam 550 in acousto-optic modulator 510. One of the two beam components can be directed to a reference arm of the heterodyne interferometer to form a reference beam and the other beam component can be directed to a measurement arm of the heterodyne interferometer to form a measurement beam.

In some embodiments, downstream application 520 can include a detector that can be used to measure the amplitude, phase, wavelength, and/or other properties of modulated beam 560. The detector can provide feedback information to acousto-optic modulator 510 so that properties of acousto-optic modulator 510, such as the rate at which electrical energy is supplied to transducers, can be adjusted manually or in automated fashion. Detectors suitable for measuring properties of modulated beam 560 include spectrometers, interferometers, photodetectors, and other optical and electronic measurement devices. In certain embodiments, the detector can include more than one such device.

System 400 may additionally include one or more electronic devices and/or components, such as electronic controllers, that provide for the functioning of the system. For example, power sources and controllers can be connected to the one or more transducers in acousto-optic modulator 510. As another example, system 400 can include a processor configured to receive feedback information from a detector, and further configured to adjust one or more operating parameters of acousto-optic modulator 510 based on the feedback information.

Figure 2:
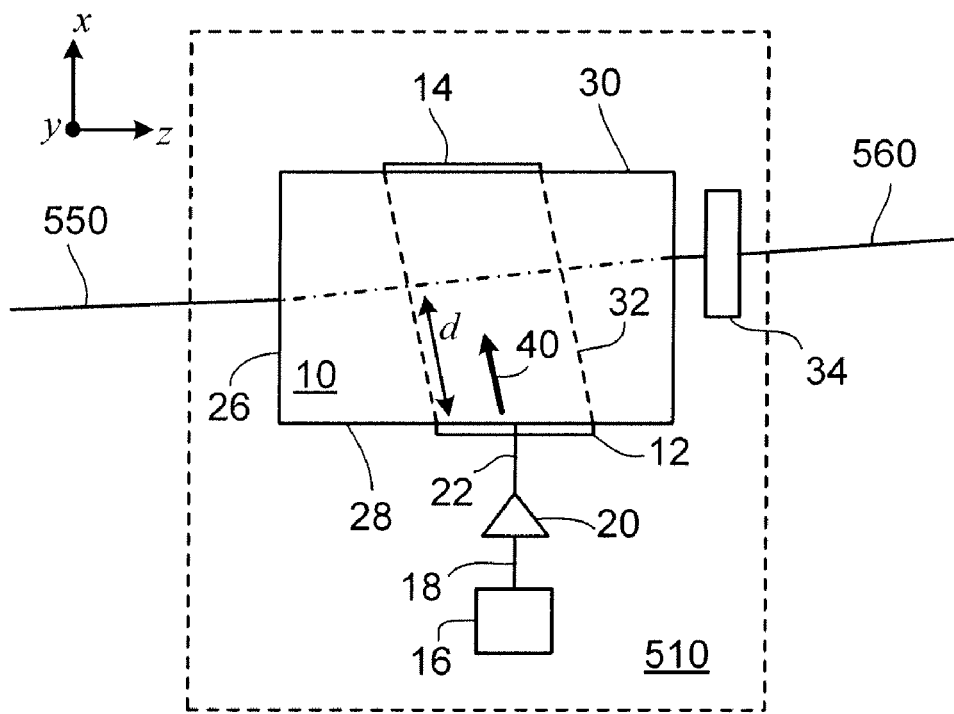
FIG. 2 is a schematic diagram of an embodiment of an acousto-optic modulator.

FIG. 2 is a schematic diagram of acousto-optic modulator 510. Optical beam 550 is incident on an input interface 26 of acousto-optic cell 10. Cell 10 (e.g., a rectangular prism) includes an optical substrate material. Positioned on an interface 28 of cell 10 is a transducer 12. The opposite interface 30 of cell 10 includes an acoustic absorber 14 positioned thereon. During operation, electrical oscillator 16, under the influence of a controller (not shown), provides an electrical signal 18 to power amplifier 20. Power amplifier 20 increases the intensity of electrical signal 18 to produce amplified signal 22, which is communicated to the electrodes of transducer 12. Transducer 12, in response to signal 22, generates acoustic wave 40 in cell 10. Acoustic wave 40 is disposed within a portion 32 of cell 10 and is launched from the portion of interface 28 adjacent to transducer 12. Acoustic wave 40 propagates along a direction in the x-z plane. Since optical beam 550 also propagates in the x-z plane, the x-z plane is referred to as the "interaction plane."

Acoustic wave 40 propagates from interface 28 of cell 10 towards interface 30. Acoustic absorber 14 is suitably positioned to receive and absorb the energy of acoustic wave 40, thereby reducing the acoustic amplitude and preventing reflection of acoustic wave 40 from interface 30 back toward interface 28.

Acoustic wave 40 produces a change in one or more properties of portion 32 of cell 10. The change in one or more properties can include, for example, a change in the index of refraction, a change in density, a change in the absorption spectrum, and/or changes in other properties. These changes are, in general, not permanent, and the magnitude of the changes may depend on the amplitude of acoustic wave 40. When the amplitude of acoustic wave 40 is zero, the properties of portion 32 of cell 10 are generally the same as the properties of the other portions of cell 10.

Optical beam 550 is directed to pass through portion 32 of cell 10 that includes acoustic wave 40. Optical beam 550 interacts with the material of portion 32 in a different manner than with the material of the other portions of cell 10 due to the one or more changed properties in portion 32. In general, optical beam 550 undergoes modulation in amplitude, or in phase, or in both amplitude and phase, as a result of the interaction in portion 32. For example, in some embodiments, acoustic wave 40 modifies portion 32 of cell 10 to include spatially-alternating regions of optical substrate material having a density larger than the bulk density of the substrate material and regions of density smaller than the bulk density of the substrate material. A spacing between the alternating regions corresponds to a frequency of acoustic wave 40. The regions of high and low density in portion 32 typically have refractive indices that are alternately higher and lower than the bulk refractive index. These regions form a diffraction grating internal to acousto-optic cell 10. Optical beam 550 can diffract on passing through the diffraction grating, and the diffraction interaction can alter the amplitude, the phase, or both the amplitude and phase, of optical beam 550. Optical beam 550 can be diffracted into multiple diffraction orders, and the multiple diffraction orders can have the same or different intensities and/or the same or different phases.

In some embodiments, optical beam 550 can undergo a frequency shift on passing through portion 32. For example, as a result of small-angle Bragg diffraction in portion 32, modulated beam 560 can include a non-zero order diffracted beam component having a frequency that is different from optical beam 550. In certain embodiments, modulated beam 560 can include multiple beam components corresponding to different diffracted orders. Some of the multiple beam components can have the same frequency, which can be the frequency of optical beam 550 or another frequency. Some of the multiple beam components can have frequencies which are different from the frequencies of all of the other beam components.

In some embodiments, the polarization of optical beam 550 can be changed on passing through portion 32. For example, in some embodiments, optical beam 550 can enter acousto-optical cell 10 as a linearly polarized optical beam, and modulated beam 560 can emerge from cell 10 having one or more components that are linearly polarized (e.g., in the same or a different direction relative to optical beam 550) or not linearly polarized (e.g., circularly polarized, elliptically polarized).

In certain embodiments, other properties of optical beam 550 can be changed on passing through portion 32, such as, for example, a spatial position of optical beam 550. In general, more than one property of optical beam 550 can be changed in the interaction with portion 32 of cell 10. For example, both the amplitude and phase of beam 550 can be changed.

In some embodiments, acousto-optic modulator 510 includes one or more optical elements 34 configured to adjust the polarization state of modulated beam 560. For example, in certain embodiments, modulated beam 560 includes two beam components having different frequencies emerging from acousto-optic cell 10. Either or both of the two beam components can have polarization states that are not linear (e.g., circular, elliptical). Optical element 34 can be configured to convert the polarization states of the beam components to linear polarization states. For example, after passing through element 34, modulated beam 560 can include two linearly and orthogonally polarized beam components having different frequencies.

In certain embodiments, element 34 can be a waveplate. For example, input optical beam 550 can have a wavelength $\lambda$, and element 34 can be a half-waveplate at $\lambda$, or a quarter-waveplate at $\lambda$, or another type of waveplate at $\lambda$. Optical element 34 can be formed from a birefringent material such as quartz, for example. Alternatively, or in addition, acousto-optic modulator 510 can include other types of elements 34 configured to adjust the polarization states of beam components of modulated beam 560, such as liquid crystal modulators.

Figure 3A:
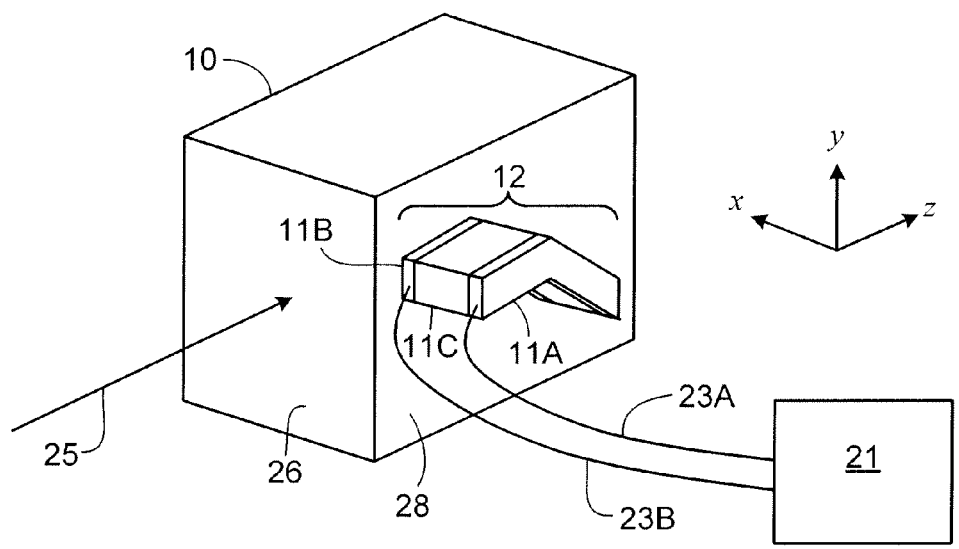
FIG. 3A is a perspective view of an embodiment of an acousto-optic cell.

FIG. 3A shows an embodiment of acousto-optic cell 10. A direction of incidence of optical beam 550 upon input interface 26 is indicated by arrow 25. Acousto-optic cell 10 includes one or more optical substrate materials, each of which can be optically isotropic or anisotropic. Positioned on interface 28 of acousto-optic cell 10 is transducer 12. Transducer 12 includes electrodes 11A and 11B on opposite surfaces, and a layer of transducer material 11C between the electrodes. Electrodes 11A and 11B are coupled to a power supply 21 via communication lines 23A and 23B to apply a potential difference across transducer 12. Providing a potential difference across the electrodes of transducer 12 can induce a change in a dimension of transducer material 11C, launching an acoustic wave into the material of acousto-optic cell 10.

In general, transducer 12 can be formed from a piezoelectric material such as $LiNbO_3$ for example, or from other piezoelectric materials. Electrodes 11A and 11B can be formed from a variety of materials. For example, the electrodes can be formed from materials containing metals such as silver, copper, aluminum, chromium, and other materials that have high electrical conductivity. In some embodiments, electrodes 11A and/or 11B can include more than one material. For example, electrodes 11A and/or 11B can include a first layer of about 20 nm of chromium deposited on an interface of a piezoelectric material, and a second layer of a second material such as gold deposited atop the first layer. In certain embodiments, electrodes 11A and 11B can be formed from the same material. In other embodiments, the electrodes are formed from different materials.

In some embodiments, transducer 12 can be positioned on more than one surface of acousto-optic cell 10. For example, transducer 12 can be positioned at a corner of acousto-optic cell 10, so that portions of transducer 12 are positioned on interface 28, and portions are positioned on another interface such as interface 26. Further, any or all of the edges or surfaces of transducer 12 can be clamped or unclamped.

In general, the shape of transducer 12 can be selected as desired. For example, in some embodiments, the shape of transducer 12 can be chosen to provide an acoustic wave in acousto-optic cell 10 that has a desired amplitude and/or acoustic phase profile. Selection of the shape of transducer 12 will be discussed in more detail later. In general, the shape of transducer 12 is determined by the dimensions of electrodes 11A and 11B, and by the dimensions of transducer material layer 11C. In some embodiments, electrodes 11A and 11B and transducer material layer 11C have the same shape (e.g., transducer 12 in FIG. 3A). In certain embodiments, any of electrodes 11A and 11B and transducer material layer 11C can have different shapes. For example, if electrodes 11A and 11B have the same shape, are smaller than transducer material layer 11C, and are positioned entirely within the edges of material layer 11C, then electrodes 11A and 11B define the shape of transducer 12. In general, the shape of transducer 12 is defined by those portions of the transducer structure that include at least one layer of transducer material sandwiched between two electrodes. In the discussion of transducer shapes that follows, variation of the transducer shape can generally be accomplished by varying the shapes of any of electrode 11A, electrode 11B, and transducer material layer 11C.

Acousto-optic cell 10 can include one transducer 12, as shown in FIG. 3A, or can include more than one transducer. For example, in embodiments designed to produce a modulated beam 560 having two beam components, one of which has a frequency different from the central frequency of optical beam 550, acousto-optic cell 10 can include two or more transducers 12. Multiple transducers can be positioned adjacent or nearly-adjacent to one another to form a transducer array, for example, or they may be spaced apart. If cell 10 includes more than one transducer, the transducers can all have the same shape, or they can have different shapes. The transducers can each have independent electrodes, and/or controllers, and/or electrical oscillators, and/or power amplifiers, or they may share these features and devices. The multiple transducers can be configured to produce acoustic waves of the same frequency or differing frequencies, for example.

Figure 3B:
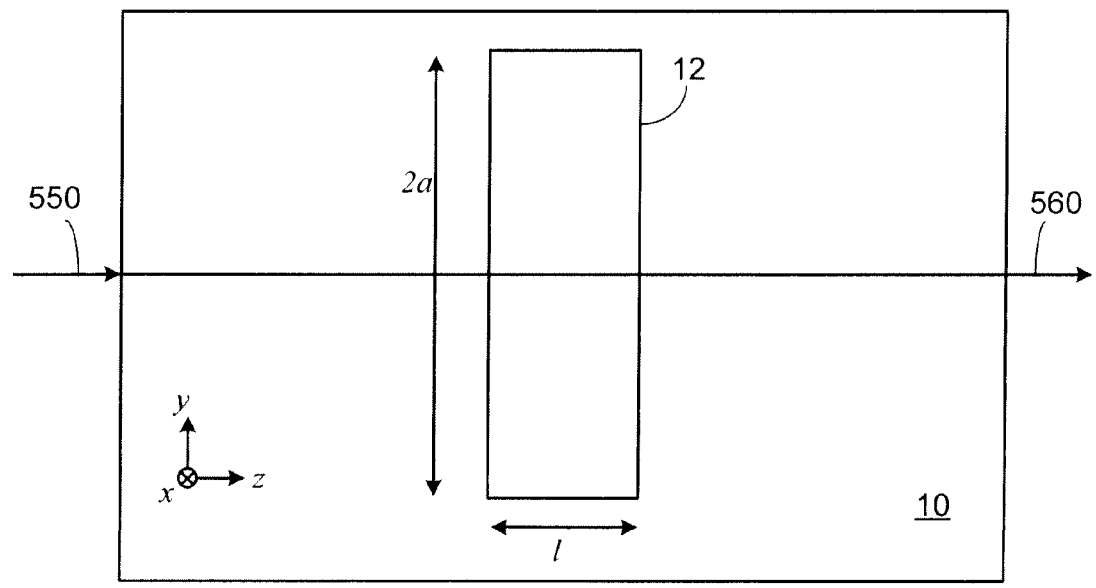
FIG. 3B is a plan view of an embodiment of an acousto-optic cell.

In general, when optical beam 550 undergoes diffraction on passing through portion 32 of acousto-optic cell 10, the spatial amplitude and phase profiles of modulated beam 560 in a plane transverse to the propagation direction of optical beam 550 can be different from the spatial amplitude and phase profiles of optical beam 550. The spatial amplitude and phase profiles of modulated beam 560 depend on the spatial amplitude and phase profiles of optical beam 550, and on the spatial amplitude and phase profiles of acoustic wave 40. In turn, the spatial amplitude and phase profiles of acoustic wave 40 depend on the shape of transducer 12 used to produce the acoustic wave, the propagation distance d the acoustic wave travels prior to interacting with optical beam 550, and the properties of the optical substrate material of acousto-optic cell 10. FIG. 3B shows a schematic diagram of a side view, in the y-z plane, of acousto-optic cell 10. Optical beam 550 enters cell 10 along a direction in the interaction (x-z) plane, propagates through the cell, and emerges as modulated beam 560. Transducer 12 is disposed on a side of cell 10 and is used to produce an acoustic wave therein. In this embodiment, transducer 12 has a rectangular shape, with height 2a in the y direction and width l in the z-direction.

Transducer 12 produces an acoustic wave 40 that propagates along a direction in the interaction plane and has a three-dimensional spatial profile. Therefore, when optical beam 550 is diffracted on passing through portion 32 of acousto-optic cell 10, properties of modulated beam 560 such as its amplitude and phase profiles, can be modulated along three independent coordinate axes.

Diffraction effects that occur in the x-y plane, and their influence with respect to the diffraction efficiency of an acousto-optic device, are described for example in Section 7.4 entitled "Acoustic Wave Diffraction Loss" of the book *Acousto-Optic Devices* (Wiley-Interscience Publications, 1992) by Jieping Xu and Robert Stroud, the contents of said section being incorporated herein by reference. If it is assumed that acoustic wave 40 propagates along the x-axis, the angular spectrum U of the acoustic wave can be expressed in terms of the two-dimensional Fourier transform as $$U(K_y) = \int_{-\infty}^{\infty} u(0, y)\exp(-iK_y y)\,dy \tag{1}$$

where u(x,y) is the acoustic field distribution and $K_y$ is the component of the acoustic wavevector in the y direction. The diffraction field distribution of the acoustic wave, which arises in part due to the shape of transducer 12, can be written in real space in terms of the inverse Fourier transform as $$u(x, y) = \frac{1}{2\pi}\int_{-\infty}^{\infty}[U(K_y)\exp(iK_x)]\exp(iK_y y)\,dK_y, \ x \geq 0 \tag{2}$$

where $U(K_y)\exp(iK_x)$ is the angular spectrum at position x, and $K_x$ is given by $$K_x = [K^2(\theta) - K_y^2]^{1/2} \tag{3}$$

When acousto-optic cell 10 includes an acoustically anisotropic material, the acoustic wave speed V(θ) and the acoustic wavevector magnitude K(θ)=Ω/V(θ) may be dependent on the propagation direction of the acoustic wave inside cell 10, where θ is the acoustic wave propagation direction and Ω is the acoustic wave angular frequency. If cell 10 includes a material that is acoustically isotropic, then the acoustic wave speed and wavevector magnitude are constant in all coordinate directions in the absence of external perturbations.

In general, the acoustic wave spatial profile in the x-y plane can be calculated for any initial profile u(0,y)—that is, for any acoustic pupil function provided by transducer 12 positioned at x=0 on an interface of cell 10—by means of Equations (1) and (2). The acoustic pupil function u(0,y) representing an acoustic wave generated by transducer 12 is substituted in Equation (1) and integrated to yield the angular spectrum in the y-direction $U(K_y)$ that corresponds to the acoustic wave. Subsequently, $U(K_y)$ can be propagated along the $K_x$ direction in wavevector space and then the inverse Fourier transform can be taken using the kernel of Equation (2) to yield the spatial profile of acoustic wave 40 in the x-y plane.

For example, in the embodiment of acousto-optic cell 10 shown in FIG. 3B, transducer 12 provides a rectangular acoustic pupil function with height 2a in the y direction. This pupil function can be represented as u(0,y)=rect(y/2a). Substituting this function into Equation (1) gives an angular spectrum $$U(K_y) = \frac{2}{K_y}\sin(aK_y) \tag{4}$$

In order to demonstrate the effects of diffraction in the x-y plane on acoustic wave 40, the wavevector magnitude of the acoustic wave can be represented in a second order approximation about a pure acoustic mode direction θ as $$K(\theta) = K_0\left(1 - \frac{\gamma}{2}\theta^2\right) \tag{5}$$

where γ is a constant that depends on the optical substrate material of acousto-optic cell 10. For example, if acoustic wave 40 is a slow shear wave in the x-y plane of an acoustically anisotropic medium such as a TeO$_2$ crystal, for example, then the value of γ is about 10.7.

Substituting Equations (1) and (5) into Equation (2), using the small angle approximation $\theta \approx K_y/K_0$, and introducing the dimensionless parameters $$X \equiv \frac{x}{a} \quad Y \equiv \frac{y}{a} \quad \kappa \equiv aK_y \quad b \equiv aK_0, \tag{6}$$

then to a good approximation for a high aspect ratio rectangular acoustic pupil function, the real space acoustic wave profile can be written as $$u(X, Y) = \frac{1}{2\pi} \int_{-g(\gamma)b}^{g(\gamma)b} \frac{\sin\kappa}{\kappa} \exp\left\{i\left[X\left[(b^2 - \frac{\gamma}{2}\kappa^2) - \kappa^2\right]^{1/2} + Y\kappa\right]\right\} d\kappa \quad (7)$$

where $$g(\gamma) = \frac{1}{\gamma}[(1 + 2\gamma)^{1/2} - 1] \quad (8)$$

Figure 4A:
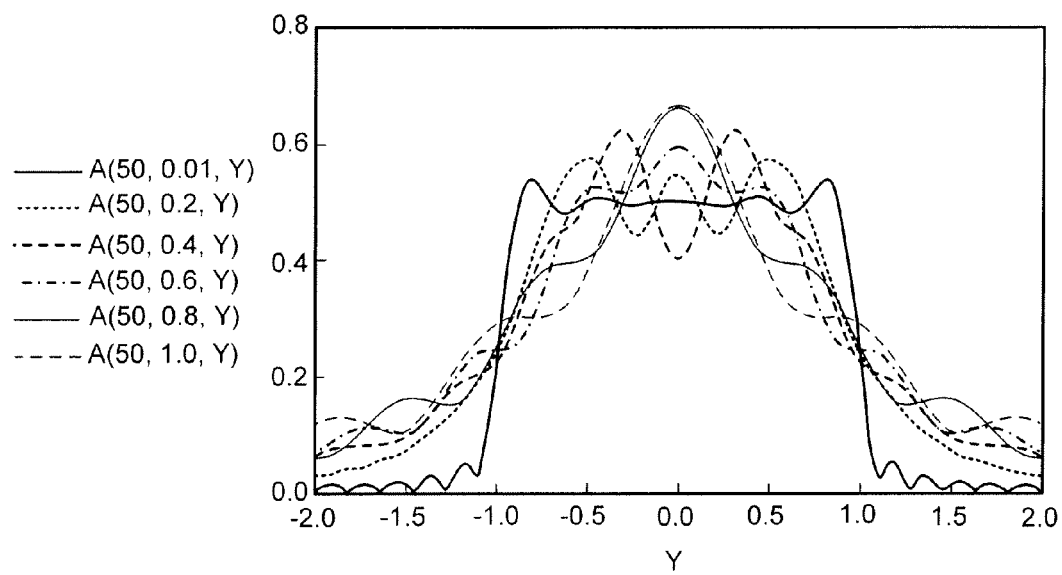
FIG. 4A is a plot of near-field acoustic wave amplitude as a function of a transverse spatial coordinate Y that results from using a rectangular acoustic pupil function in an acousto-optic modulator.
Figure 4B:
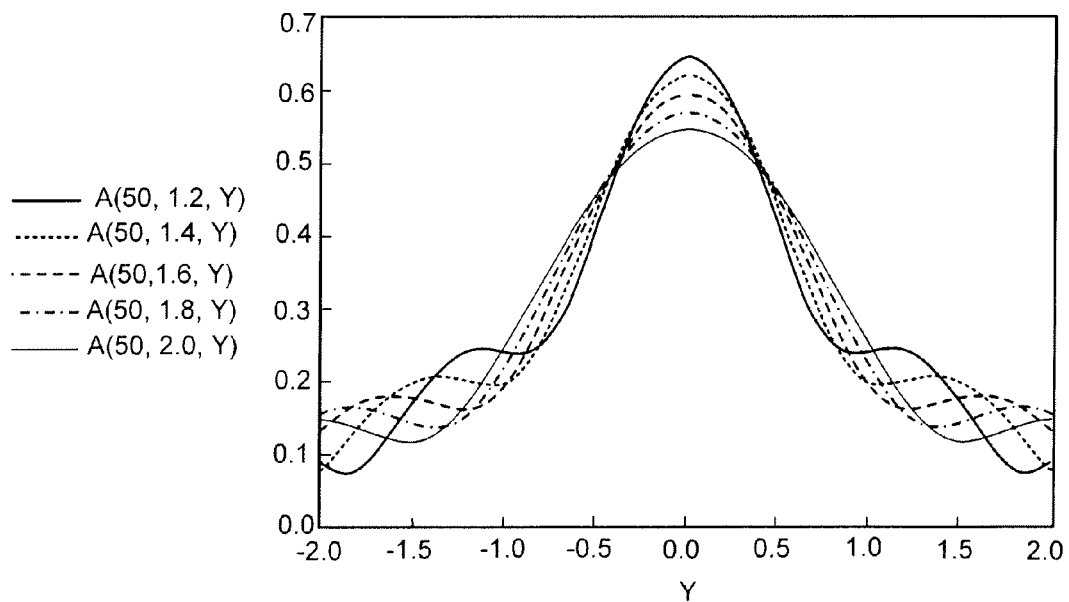
FIG. 4B is a plot of far-field acoustic wave amplitude as a function of a transverse spatial coordinate Y that results from using a rectangular acoustic pupil function in an acousto-optic modulator.

For any value of the normalized distance X, the complex amplitude u(X,Y) of the acoustic field distribution can be calculated as a function of the normalized transverse distance Y using Equation (7). FIG. 4A shows a plot of the acoustic field amplitude A(b, X, Y)=|u(X,Y)| for the rectangular transducer of FIG. 3B, with γ=11, b=50 and 0<X≦1. FIG. 4B shows a plot of the acoustic field amplitude in the region 1<X≦2, with the other parameters having the same values. In the region shown in FIG. 4A, for which X takes values less than about 1, the acoustic waves all have amplitude profiles wherein most of the acoustic wave energy remains within an aperture width a in the y direction. The region that includes X≦1 is referred to as the near-field or Fresnel region. At very small values of X that correspond to acoustic wave 40 very near to transducer 12, the amplitude profile of acoustic wave 40 along the y direction closely resembles a square wave. As acoustic wave 40 propagates further away from transducer 12 and into cell 10 (larger values of X), the amplitude profile of acoustic wave 40 becomes more narrowly peaked toward the center of the waveform, with more acoustic wave amplitude in the wings.

When X takes values larger than about 1, as shown in FIG. 4B, a significant portion of the acoustic wave energy is outside the transducer aperture width a in the y direction. The region that includes X>1, in which acoustic wave 40 has propagated for some distance along the x axis, is referred to as the far-field or Fraunhofer region. In the far-field region, the acoustic energy tends to diverge out of the region corresponding to the transducer aperture width a in the y direction, and the acoustic wavefront transitions to that of a diverging beam. In this region, diffraction of acoustic wave 40 is significant, and results in a significant change in the spatial amplitude profile of acoustic wave 40.

In general, transducer 12 can have a variety of shapes, and the amplitude and phase profiles of acoustic wave 40 produced by transducer 12 can vary according to the shape of transducer 12. Accordingly, for a transducer 12, an acoustic near-field region of acoustic cell 10 along a particular direction (e.g., the x direction) includes a domain where a full width at half maximum (FWHM) distribution of the acoustic wave amplitude in the y direction is less than or equal to a corresponding maximum dimension of transducer 12 in the y direction multiplied by the factor $2^{1/2}$. For example, the acoustic near-field region of cell 10 in the x direction includes a domain where the FWHM of the acoustic wave amplitude profile in the y direction is less than $2^{1/2}$ times a maximum dimension of transducer 12 in the y direction.

Amplitude variations of acoustic wave 40 such as those shown in FIG. 4B can produce unwanted variations in the amplitude and/or phase profile of modulated beam 560, which is generated by directing optical beam 550 to diffract from a region of cell 10 that includes acoustic waveform 40. In general, the phase Φ of acoustic wave 40 can also influence the interaction of optical beam 550 with the optical substrate material of acousto-optic cell 10. The phase of acoustic wave 40 can be determined from the acoustic field distribution u(XY) as $$\Phi(b, X, Y) = \tan^{-1}\left[\frac{\text{Im}[u(X, Y)]}{\text{Re}[u(X, Y)]}\right] - bX \quad (9)$$

Figure 5A:
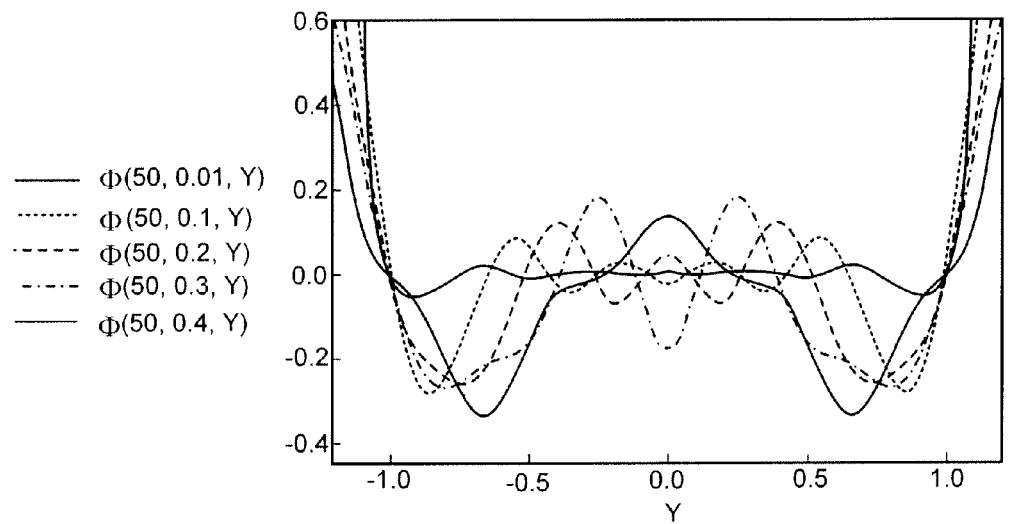
FIGS. 5A-B are plots of near-field acoustic wave phase as a function of a transverse spatial coordinate Y that result from using a rectangular acoustic pupil function in an acousto-optic modulator.
Figure 5B:
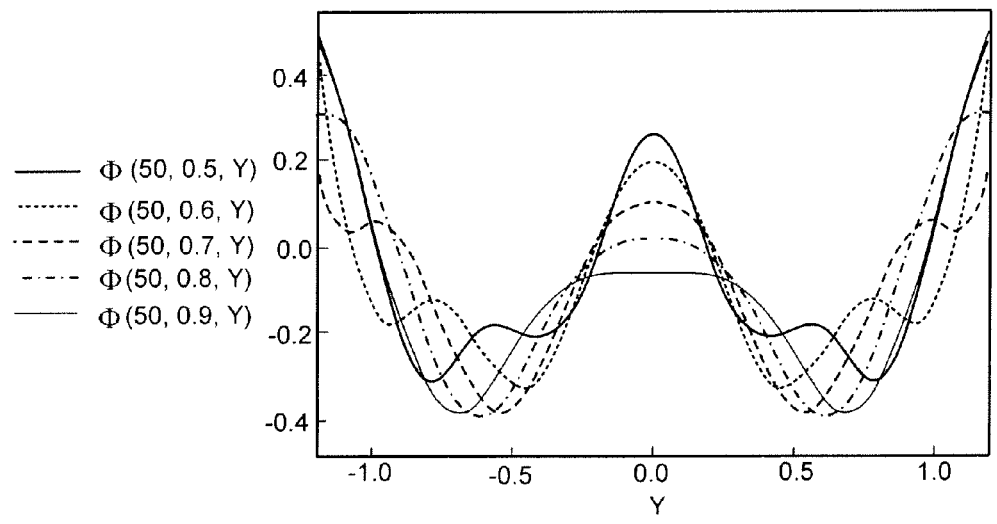
Figure 5C:
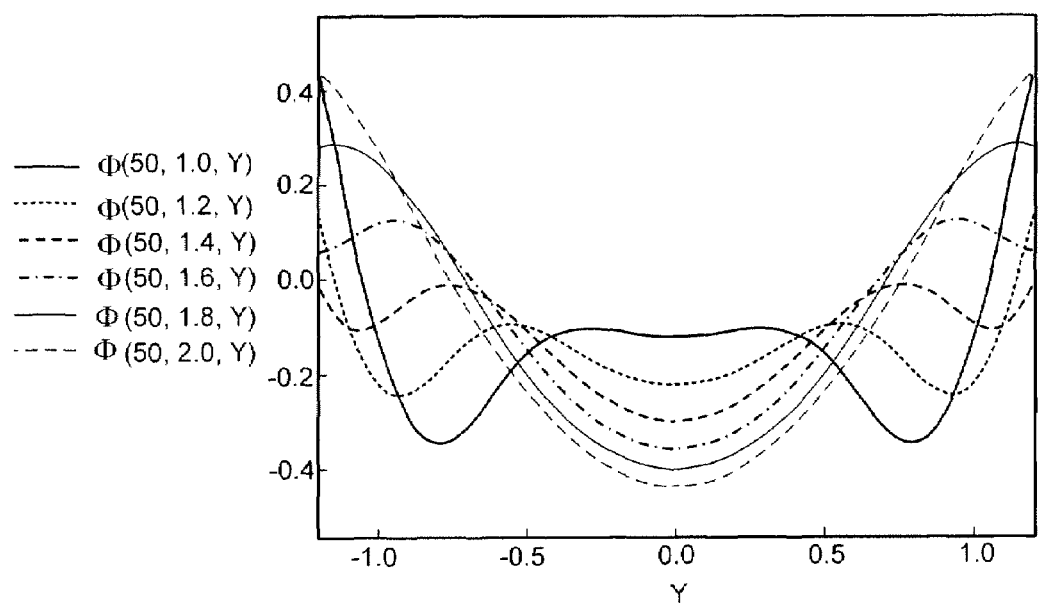
FIG. 5C is a plot of far-field acoustic wave phase as a function of a transverse spatial coordinate Y that results from using a rectangular acoustic pupil function in an acousto-optic modulator.

FIGS. 5A-C show the acoustic phase Φ0 calculated as a function of Y using γ=11 and b=50 for three different regions: 0.01≦X≦0.4, 0.5≦X≦0.9, and 1.0≦X≦2.0, respectively. FIGS. 5A and 5B correspond to the acoustic near-field region, and FIG. 5C corresponds to the acoustic far-field region. For X=0.01 in FIG. 5A, i.e., very close to transducer 12, the acoustic phase is relatively uniform along the y direction within an aperture width a of transducer 12. However, for larger values of X, even within the acoustic near-field region, the acoustic phase varies significantly across the spatial profile of acoustic wave 40 within the aperture width of transducer 12 in the y direction. These acoustic phase variations can produce variations in either the amplitude or phase, or both the amplitude and phase, of optical beam 550 when it diffracts in cell 10.

To a first approximation, the phase profile Φ of acoustic waveform 40 is transferred to optical beam 550 when the optical beam propagates through a region of acousto-optic cell 10 that includes acoustic waveform 40. Far-field diffraction of acoustic wave 40, as shown in FIG. 5C, can introduce substantial amplitude and/or phase modulation in modulated beam 560. In order to circumvent far-field diffraction effects due to acoustic waveform 40, acousto-optic cell 10 can be operated in a near-field regime. That is, optical beam 550 can be directed to propagate through a region of acousto-optic cell 10 that corresponds to the acoustic near-field region.

Figure 6B:
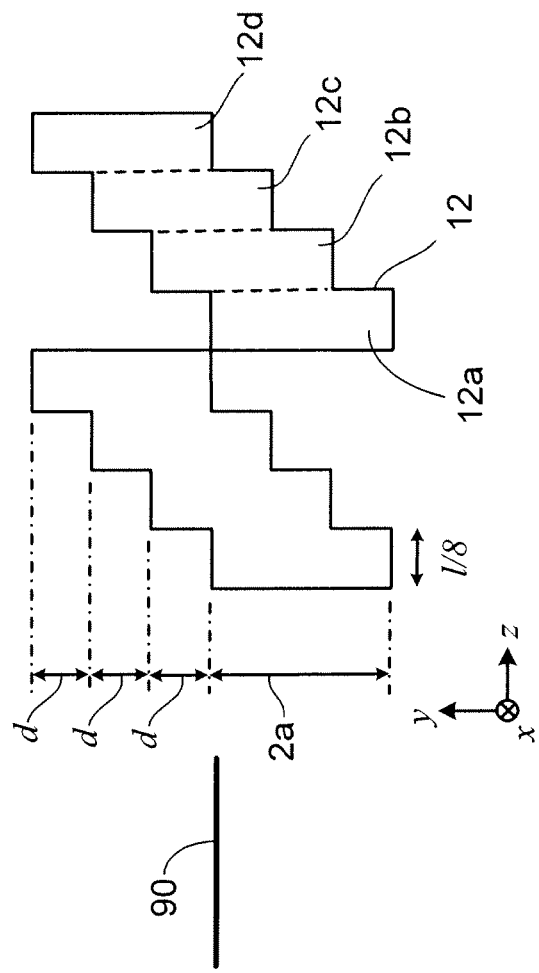
FIGS. 6A-B are schematic diagrams of embodiments of transducers that provide apodized acoustic pupil functions.
Figure 6A:
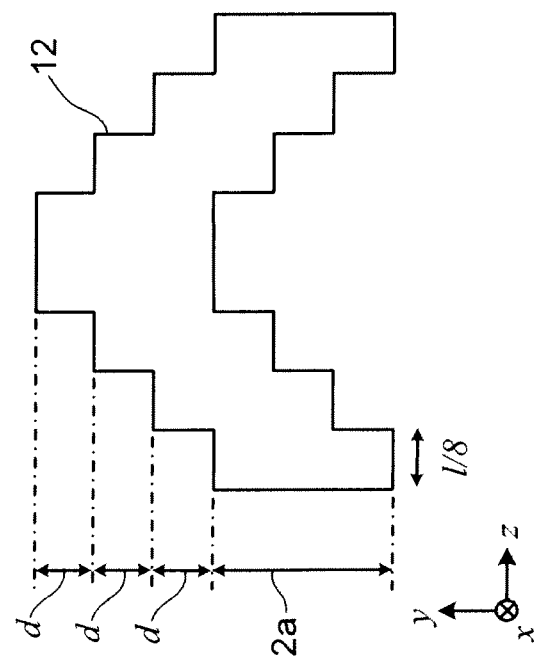

In the acoustic near-field region, the amplitude of acoustic wave 40 along the y direction can be relatively uniform within the aperture width a of transducer 12, as shown in FIG. 4A, but the acoustic phase of acoustic wave 40 includes significant variations, as shown in FIGS. 5A and 5B. Acoustic phase variations can be reduced, however, by apodizing the acoustic pupil function provided by transducer 12. Therefore, a method to reduce acoustic phase variations in acoustic wave 40 includes using a transducer 12 having a shape configured to produce an apodized acoustic pupil function. FIGS. 6A and 6B are schematic diagrams of two different embodiments of transducer 12 that introduce apodized acoustic pupil functions. Transducer 12 in FIG. 6A includes a rectangular sub-portion of height 2a in the y direction and width 1/8 in the z direction. The transducer further includes 7 replicas of the rectangular sub-portion, arranged variously at the same position as the first portion in the y direction, and at heights of d, 2d and 3d above the first portion, to yield a transducer 12 having a shape that is extended in the y direction toward the middle (along the z direction) relative to either of the ends, and is symmetric about its midpoint on the z axis. The transducer in FIG. 6A is a continuous structure with no divisions between portions.

The transducer shown in FIG. 6B has a shape that has some features in common with the transducer of FIG. 6A. Transducer 12 shown in FIG. 6B includes a first half with a first portion of height 2a in the y direction and width 1/8 in the z direction, and three additional portions of similar dimension to the first portion and arranged at heights d, 2d and 3d above the first portion. The second half of the transducer has dimensions that are similar to the first half. Reflecting the second half about axis 90 would yield the transducer shown in FIG. 6A.

The phase of acoustic wave 40 in the y direction produced by the transducers shown in FIGS. 6A and 6B is nominally the same, because the contribution of each transducer to the acoustic waveform in the y direction is the same. The acoustic phase $\Phi_4(b,X,Y)$ can be written as a sum over the contributions of each of the y-positioned sub-portions of transducer 12. For either of the transducers shown in FIGS. 6A and 6B, the acoustic phase can be nominally written as $$\Phi_4(b, X, Y) = \frac{1}{4}[\Phi_a(b, X, Y) + \Phi_b(b, X, Y) + \Phi_c(b, X, Y) + \Phi_d(b, X, Y)] \quad (10)$$

The four contributions to the acoustic phase $\Phi_4$ arise from four different sub-portions of transducer 12. For example, referring to FIG. 6B, four portions of transducer 12 are labeled 12a, 12b, 12c, and 12d, respectively. If we set y=0 at the position of axis 90, then portion 12a contributes a phase $\Phi_a$ to $\Phi_4$ that is spatially symmetric about y=−3d/2. Portion 12b contributes a phase $\Phi_b$ to $\Phi_4$ that is spatially symmetric about y=−d/2. Portion 12c contributes a phase $\Phi_c$ to $\Phi_4$ that is spatially symmetric about y=d/2. Portion 12d contributes a phase $\Phi_d$ to $\Phi_4$ that is spatially symmetric about y=3d/2. Because the dimensions of each of portions 12a, 12b, 12c, and 12d are the same, each contributes equally to the overall acoustic phase $\Phi_4$. The other half of transducer 12 (the left half in FIG. 6B) produces a phase contribution that is identical in form to the right half, since the left and right halves have identical shapes. As a result, the form of the overall acoustic phase $\Phi_4$ described by Equation (10) does not change. Similarly, in FIG. 6A, transducer 12 can be divided into multiple sub-portions, each having a position relative to axis 90 that corresponds to one of the sub-portions of transducer 12 in FIG. 6B. Further, the sizes of the sub-portions of transducer 12 in FIG. 6A are identical to those of the sub-portions of transducer 12 in FIG. 6B. Thus, Equation (10) can also describe the acoustic phase $\Phi_4$ produced by transducer 12 in FIG. 6A. The two transducers, in operation, produce acoustic waves 40 having nominally identical phase profiles in the y direction. As a result, optical beam 550 passing through a region of acousto-optic cell 10 that includes acoustic wave 40 produced by either of the transducers 12 in FIG. 6A or 6B will acquire an optical phase from acoustic wave 40 that has a y dependence that is substantially the same in either case.

Figure 6C:
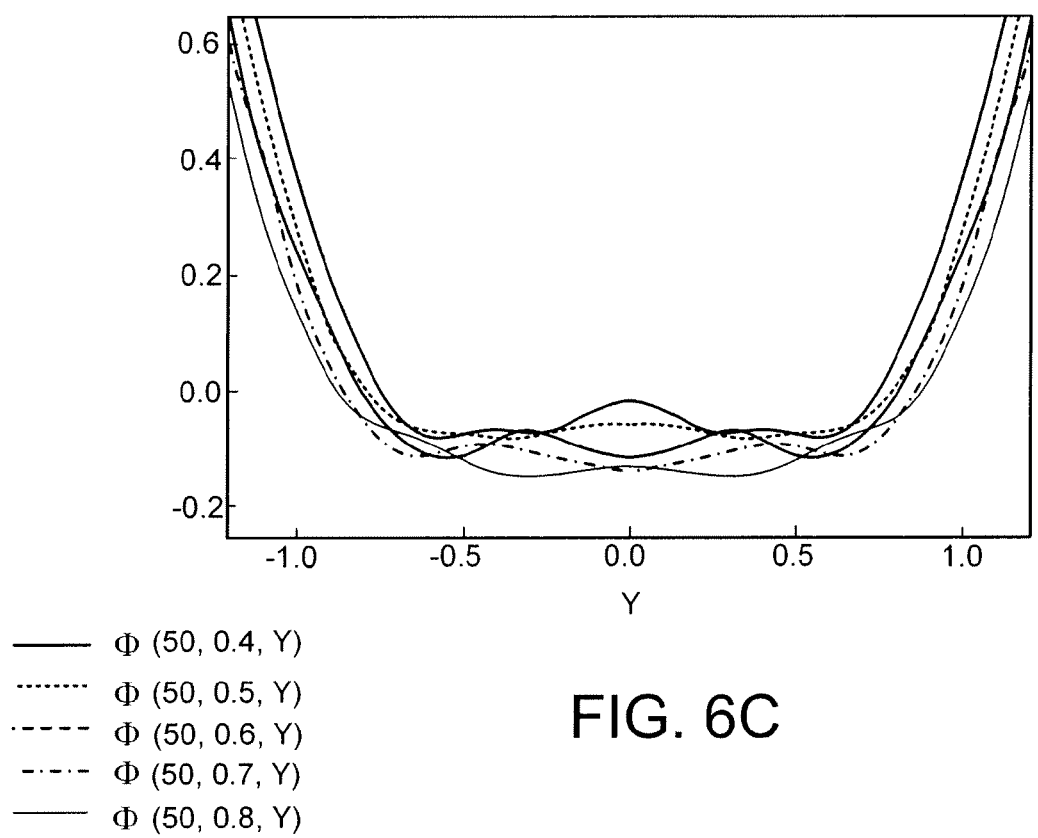
FIG. 6C is a plot of near-field acoustic wave phase as a function of a transverse spatial coordinate Y that results from using acoustic pupil functions provided by the transducers of either FIG. 6A or FIG. 6B in an acousto-optic modulator.

FIG. 6C shows a plot of the acoustic phase for acoustic wave 40 produced using either of the transducers of FIGS. 6A and 6B for b=50 in the acoustic near-field region of acousto-optic cell 10. The acoustic phase in a region corresponding to an aperture width a of transducer 12 (−0.5≦Y≦0.5) shows smaller variations than the acoustic phase that results from the use of a rectangular transducer, as illustrated by comparison to FIGS. 5A and 5B. An optical beam 550 directed to pass through a portion of cell 10 that includes acoustic wave 40 in the acoustic near-field region of either of the transducers 12 of FIG. 6A or 6B will interact with an acoustic wave having acoustic phase variations that are smaller in magnitude in the y direction than would otherwise result from using a transducer 12 that provides a rectangular acoustic pupil function. Therefore, induced variations in the phase and/or amplitude of modified beam 560 as a result of this interaction can be smaller than variations in amplitude and/or phase of modified beam 560 that would result from interaction with an acoustic wave produced via a transducer that provides a rectangular acoustic pupil function.

In general, transducer 12 can be configured in any desired shape in order to produce an acoustic wave 40 having a desired set of properties, e.g., spatial amplitude and/or phase profile. For example, the shape of transducer 12 can be calculated and/or optimized to produce an acoustic wave 40 having a desired amplitude and/or phase profile in the y direction. The calculation and/or optimization can be performed electronically using, for example, an electronic computer implementing Equations (1) and (2). For example, a configuration is chosen for transducer 12 so that transducer 12 produces an acoustic wave described by u(0,y). The angular spectrum $U(K_y)$ can be calculated electronically by substituting acoustic wave profile u(0,y) in Equation (1). The acoustic wave profile u(x,y) can be calculated electronically from $U(K_y)$ by implementing the propagation kernel in Equation (2).

In some embodiments, an acoustic wave profile u(x,y) can be selected initially and substituted in Equation (2). The Fourier transform of Equation (2) can be calculated electronically to determine $U(K_y)$. The angular spectrum $U(K_y)$ can then be substituted into Equation (1) and the inverse Fourier transform calculated electronically to produce u(0,y), the acoustic pupil function of transducer 12. A suitable shape for transducer 12 can be chosen to produce the acoustic pupil function u(0,y). In general, more than one shape for transducer 12 may produce nominally the same acoustic pupil function.

In some embodiments, the shape of transducer 12 can be chosen to reduce variations in the phase of acoustic wave 40 along the y direction, relative to phase variations along the y direction of an acoustic wave produced by a rectangular transducer having a length in the y direction that is the same as a maximum length of transducer 12 in the y direction. For example, in certain embodiments, a difference between a maximum phase variation of acoustic wave 40 and a maximum phase variation of an acoustic wave produced by a rectangular transducer, within an aperture width that corresponds to a maximum length of transducer 12 in the y direction, and in an acoustic near-field region of acousto-optic cell 10, is at least about 0.005 radian (e.g., at least about 0.007 radian, at least about 0.010 radian, at least about 0.013 radian, at least about 0.016 radian, at least about 0.020 radian, at least about 0.030 radian, at least about 0.040 radian, at least about 0.050 radian).

In certain embodiments, transducer 12 can be shaped so that the maximum phase variation of acoustic wave 40 within an aperture region that corresponds to the maximum length of transducer 12 along the y direction, in an acoustic near-field region of acousto-optic cell 10, is less than about 0.005 radian (e.g., less than about 0.003 radian, less than about 0.001 radian, less than about 0.0005 radian).

In some embodiments, the shape of transducer 12 can be chosen to reduce variations in the amplitude of acoustic wave 40 along the y direction within an acoustic near-field region of acoustic cell 10. Alternatively, in certain embodiments, the shape of transducer 12 can be chosen to impart a particular amplitude profile (e.g., a square-wave profile, a sawtooth profile, a sinusoidal profile, or another profile) along the y direction to acoustic wave 40. In some embodiments, the shape of transducer 12 can be chosen to reduce variations in both the amplitude and phase of acoustic wave 40 along the y direction within an acoustic near-field region of acoustic cell 10. Because modulated beam 560 is generated via an interaction with acoustic wave 40, the shape of transducer 12 can be chosen to produce modulated beam 560 having a selected modulation in amplitude, in phase, in both amplitude and phase, and/or in one or more other properties.

The shapes of the transducers shown in FIGS. 6A and 6B can, in general, be altered to provide acoustic aperture functions that are even more highly structured in the y direction. For example, the transducers in FIGS. 6A and 6B include eight sub-portions of height 2a and width l/8. However, in general, transducer 12 can include any number of sub-portions, arranged in any order and/or distribution. For example, transducer 12 can include more than 8 sub-portions (e.g., 16 sub-portions or more, 32 sub-portions or more, 64 sub-portions or more) having widths in the z direction of less than l/8 (e.g., l/16 or less, l/32 or less, l/64 or less). The widths of the portions in the z direction can be so small that the stepped surfaces of the transducers shown in FIGS. 6A and 6B are reduced to straight lines. In contrast, in some embodiments, transducer 12 can include fewer than 8 sub-portions.

In some embodiments, transducer 12 can include multiple sub-portions that form a single continuous transducer. In other embodiments, discrete sub-portions can be arranged on one or more surfaces of acoustic cell 10 to form transducer 12. Each of the sub-portions, whether discrete or part of a continuous transducer, can have a center of mass and two edges parallel to the y direction, the edges of the sub-portions extending along an entire length of transducer 12 in the y direction. The sub-portions can be positioned relative to one another so that the positions of their centers of mass in the y direction vary from one side of transducer 12 to the other along the z direction, for example.

The sub-portions of transducer 12 can be positioned relative to one another so that the positions of their centers of mass in the z direction are all different. For example, referring to the 8 sub-portions shown FIG. 6B for transducer 12, each sub-portion has a center of mass located in the geometric center of the sub-portion. The sub-portions are positioned such that they extend in both the z and y coordinate directions. In the z direction, the positions of the centers of mass of the sub-portions are all different from one another. In the y direction, the positions of the centers of mass of the sub-portions can vary in a regular or irregular manner from left to right across transducer 12 (e.g., along the z direction). In some embodiments, the sub-portions can be positioned relative to one another so that the positions of their centers of mass in the y direction vary monotonically from one side of transducer 12 to the other along the z direction. For example, the positions of the centers of mass of the sub-portions can vary linearly in the y direction from one side of transducer 12 to the other along the z direction, as for the transducers shown in FIGS. 6A and 6B. Alternatively, the positions of the centers of mass of the sub-portions can vary non-linearly in the y direction from one side of transducer 12 to the other along the z direction.

In certain embodiments, each of the multiple sub-portions can have the same shape. In other embodiments, some or all of the sub-portions can have different shapes. The sub-portions can have regular shapes (e.g., rectangular shapes, trapezoidal shapes, triangular shapes, and/or other regular shapes) or irregular shapes. In some embodiments, some or all of the sub-portions can have two pairs of two parallel sides (e.g., a parallelogram shape).

In general, the shape of transducer 12 in the y direction can be complicated and/or irregular, and can be symmetric or asymmetric about any axis or point. The acousto-optic modulator can include more than one transducer, the shape of each transducer being chosen to provide a selected acoustic pupil function in the y direction. The shapes of the more than one transducer can be the same, or can be different. The transducer shapes can be chosen in order to produce acoustic waves that modulate the same property or properties of optical beam 550, or the transducer shapes can be chosen to produce acoustic waves that modulate different properties of optical beam 550.

Figure 7:
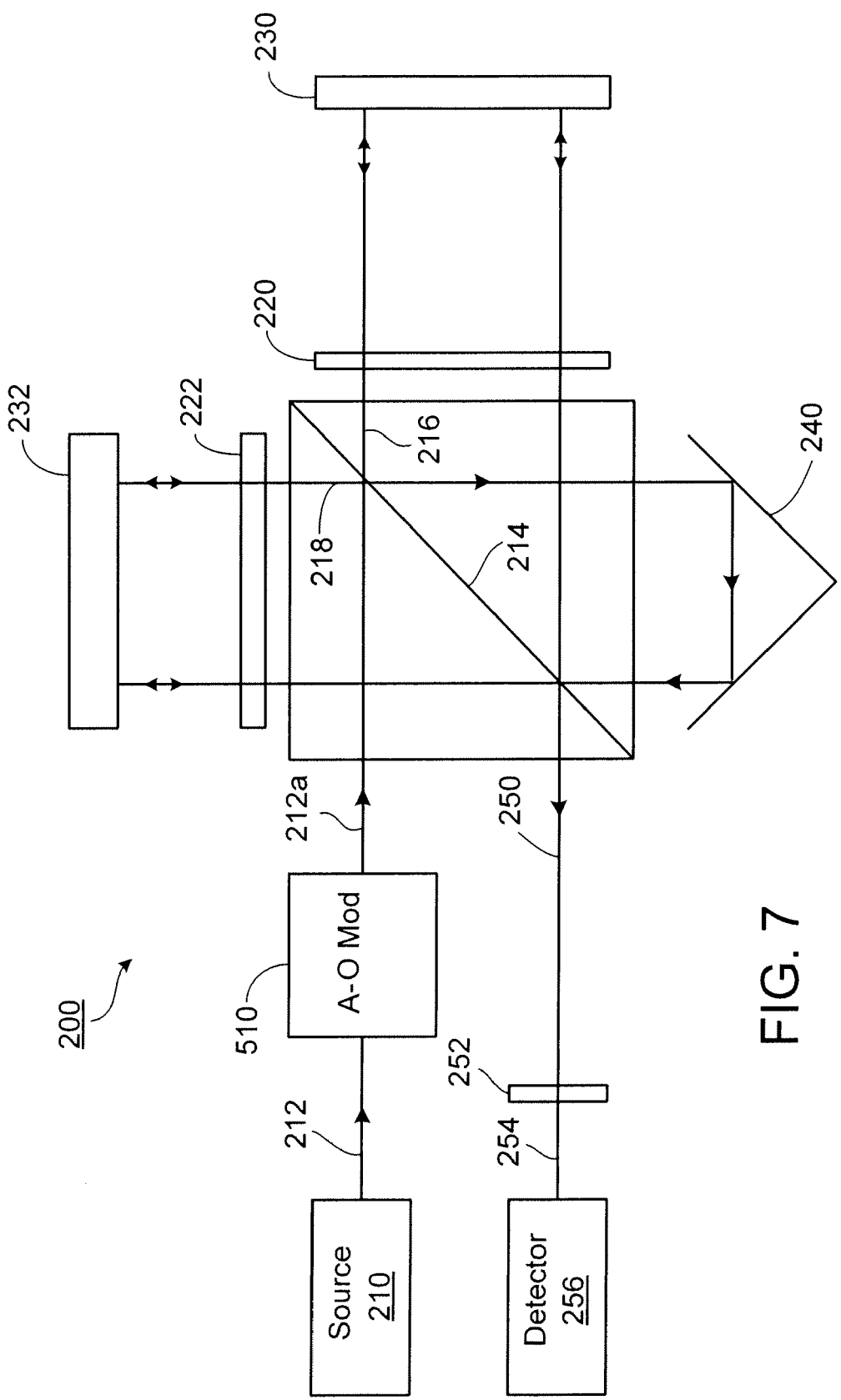
FIG. 7 is a schematic diagram of a distance measuring interferometry system including an acousto-optic modulator that provides apodized acoustic pupil functions.

Acousto-optic modulators featuring one or more transducers as described above can be incorporated into interferometry systems such as displacement or dispersion measuring interferometry systems. For example, interferometry systems can include an acousto-optic modulator 510 that generates two frequency-shifted optical beams from an input optical beam for use in heterodyne displacement measuring interferometry. FIG. 7 shows an embodiment of a displacement measuring interferometry system 200 that includes an acousto-optic modulator 510 having one or more transducers that provide one or more acoustic pupil functions that are apodized in the y direction. The displacement measuring interferometer is a high stability plane mirror interferometer (HSPMI). A light source 210 provides a linearly polarized input beam 212 that is incident on an input interface of acousto-optic modulator 510. Acousto-optic modulator 510 includes acousto-optic cell 10 that includes one or more transducers positioned on one or more surfaces of acousto-optic cell 10. Each of the transducers can be shaped to provide an acoustic pupil function that is apodized in the y direction. Input beam 212, on passing through acousto-optic modulator 510, is converted to modulated beam 212a that includes two linearly and orthogonally polarized beam components having a heterodyne frequency splitting. Beam 212a is incident on a polarizing beam splitter 214, which transmits one of the polarization components to define a measurement beam 216 and reflects the other polarization component to define a reference beam 218.

The measurement beam passes through a measurement quarter wave plate 220 and travels along a measurement path to contact a plane mirror measurement object 230, which reflects the measurement beam back through the wave plate 220 to polarizing beam splitter 214. Because of the double pass through wave plate 220, polarizing beam splitter 214 now reflects the measurement beam towards a retroreflector 240, which in turn directs the beam back to the polarizing beam splitter. Thereafter, polarizing beam splitter 214 directs the measurement beam back through wave plate 220 to make a second pass to plane mirror measurement object 230. The measurement object then reflects the measurement beam back through wave plate 220 to polarizing beam splitter 214, which, following the double pass through wave plate 220, now transmits the measurement beam as the measurement beam component of an output beam 250.

The reference beam, on the other hand, passes through a reference quarter wave plate 222 and travels along a reference path to contact a plane mirror reference object 232, which reflects the reference beam back through wave plate 222 to polarizing beam splitter 214. Because of the double pass through wave plate 222, polarizing beam splitter 214 now transmits the reference beam towards retroreflector 240, which in turn directs the beam back to the polarizing beam splitter. Thereafter, polarizing beam splitter 214 directs the reference beam back through wave plate 222 to make a second pass to plane mirror reference object 232. The reference object then reflects the reference beam back through wave plate 222 to polarizing beam splitter 214, which, following the double pass through wave plate 222, now reflects the reference beam as the reference beam component of output beam 250.

A polarizer 252 is positioned to receive output beam 250 and functions as an analyzer that selects a linear polarization that mixes the measurement and reference beam components to produce a mixed beam 254 whose intensity is measured by a detector 256. The intensity measured by the detector includes an interference signal that oscillates at the heterodyne frequency (or the sum of the heterodyne frequency and a Doppler shift if the stage is moving), and the phase of that interference signal indicates the position of the stage.

In general, undesired amplitude and/or phase modulations in the frequency-shifted components of beam 212a may produce interferometer signals and displacement measurements having unacceptably large errors. The errors in displacement measurements may arise, for example, from non-linear non-cyclic errors (NLNCE) in the interferometer.

FIGS. 5A and 5B show the acoustic phase in the y direction that results from generating acoustic wave 40 in acousto-optic modulator 510 having a transducer 12 that provides a rectangular acoustic pupil function. The acoustic phase varies along the y direction, and over a distance Y of 0.5, phase variations of the order of 0.4 radians can occur. In a linear displacement measuring where a=1 mm and in which the measurement and reference beams are expanded by a factor of about 10 using an afocal attachment, a beam shear of about 1 mm in the interferometer that is due, for example, to rotation of a plane mirror measurement object, corresponds to a change in Y of 0.05. The 0.05 change in Y accordingly induces relative phase shifts of the order of 0.04 radians in beam 212a, which is produced from the interaction of beam 212 and the portion 32 of acoustic cell 10 that includes acoustic wave 40. A phase shift of 0.04 radians in a double pass plane mirror interferometer operating at 633 nm corresponds to a NLNCE of the order of 1 nm. This generally exceeds the error budget in interferometry systems that are used, for example, in sub-nanometer stage metrology systems.

Apodizing the acoustic pupil function, as shown in FIGS. 6A and 6B, yields acoustic wave 40 having reduced variations in phase along the y direction over a selected aperture region, as shown in FIG. 6C. Using either of the transducers shown in FIG. 6A or FIG. 6B to generate acoustic wave 40, FIG. 6C shows that a 0.05 change in Y accordingly induces relative phase shifts of the order of 0.004 radians or less in acoustic wave 40 and therefore in beam 212a produced from the interaction of beam 212 and the portion 32 of acoustic cell 10 that includes acoustic wave 40. These phase shifts produce NLNCEs of the order of 50 pm or less in a double pass plane mirror interferometer.

In general, incorporation of apodized acoustic pupil functions provided by shaped transducers, and acousto-optic modulators and systems that use such transducers, into interferometry systems can increase the accuracy of the interferometer by reducing measurement errors in the interferometric signal. As a result, such interferometry systems provide highly accurate measurements, and therefore can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as non-cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which are incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 8:
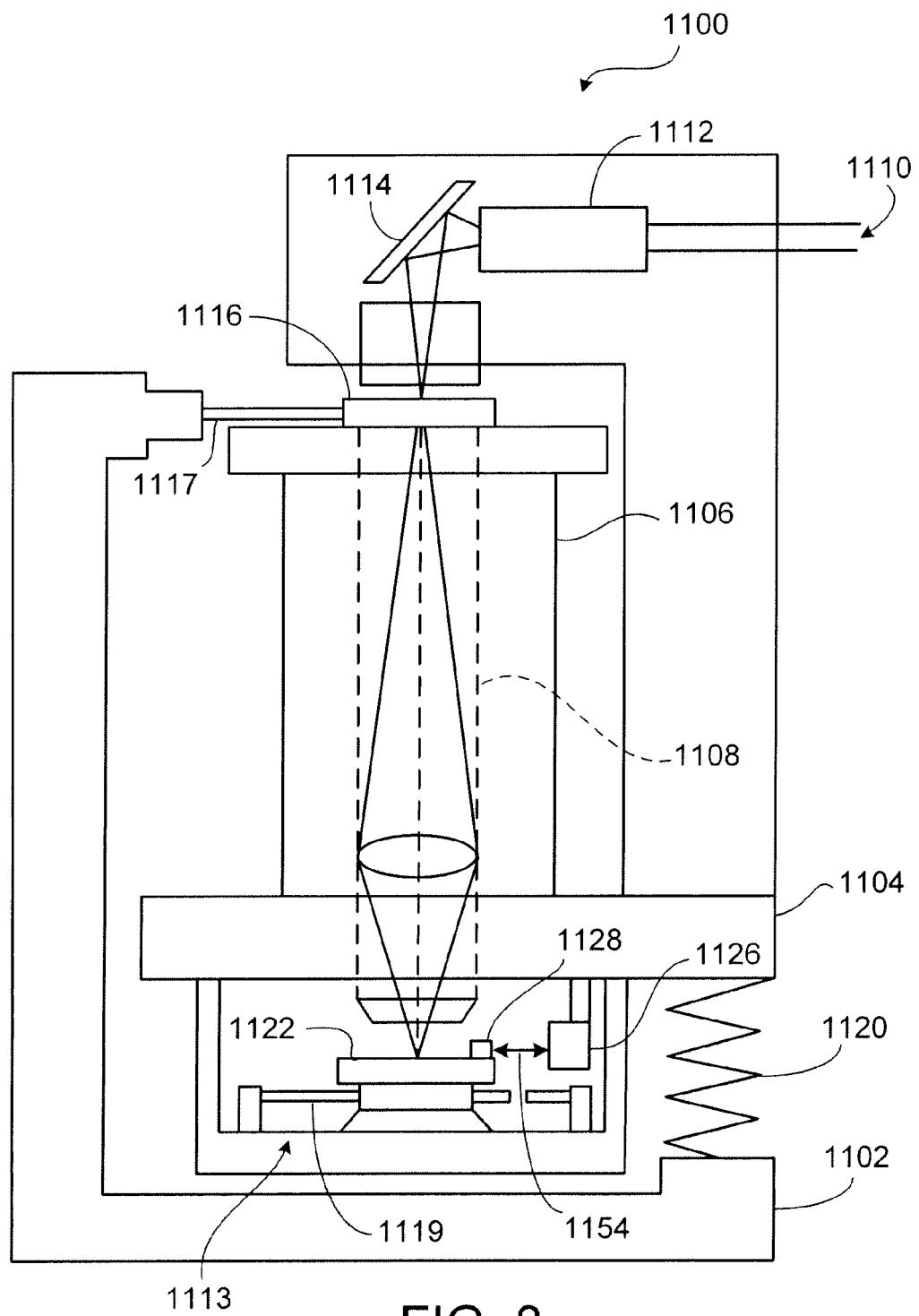
FIG. 8 is a schematic diagram of a lithography system that includes an interferometry system as described herein, and is used to make integrated circuits.

An example of a lithography scanner 1100 using an interferometry system 1126 is shown in FIG. 8. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith, *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

Figure 12:
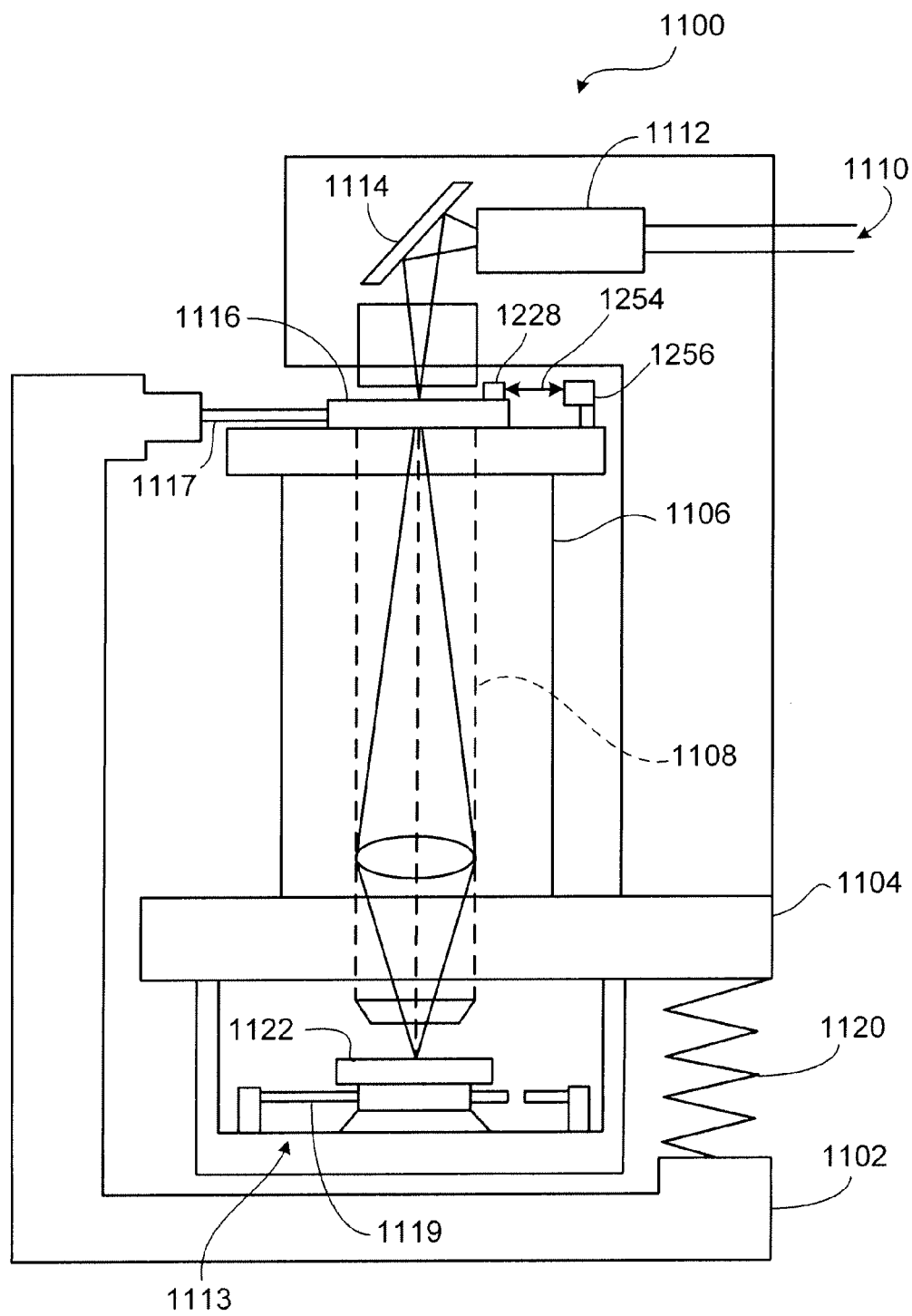
FIG. 12 is another schematic diagram of a lithography system that includes an interferometry system as described herein, and used to make integrated circuits.

In other embodiments of the lithographic scanner, one or more of the interferometry systems described previously can be used to measure distance along multiple axes and angels associated for example with, but not limited to, the wafer and reticle (or mask) stages. In particular, an example of a lithography scanner 1100 using an interferometry system 1126 to precisely measure the position of the reticle (or mask) stage 1116 is shown in FIG. 12. The interferometry system 1226 directs a measurement beam 1254 to a plane mirror 1228 situated on mask stage 1126. All other parts of the lithography scanner system are labeled identically to those shown in FIG. 8.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 9:
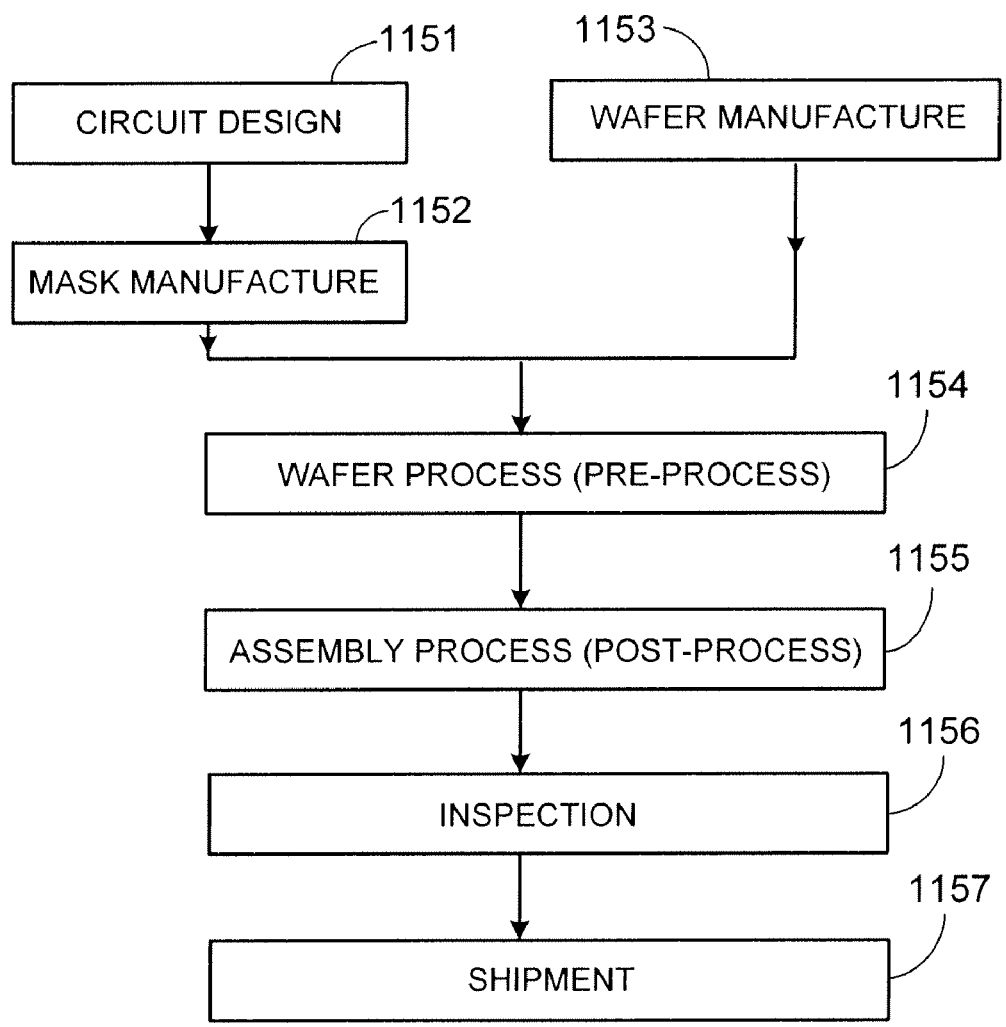
FIG. 9 is a flow chart that describes steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 9 and 10. FIG. 9 is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 10:
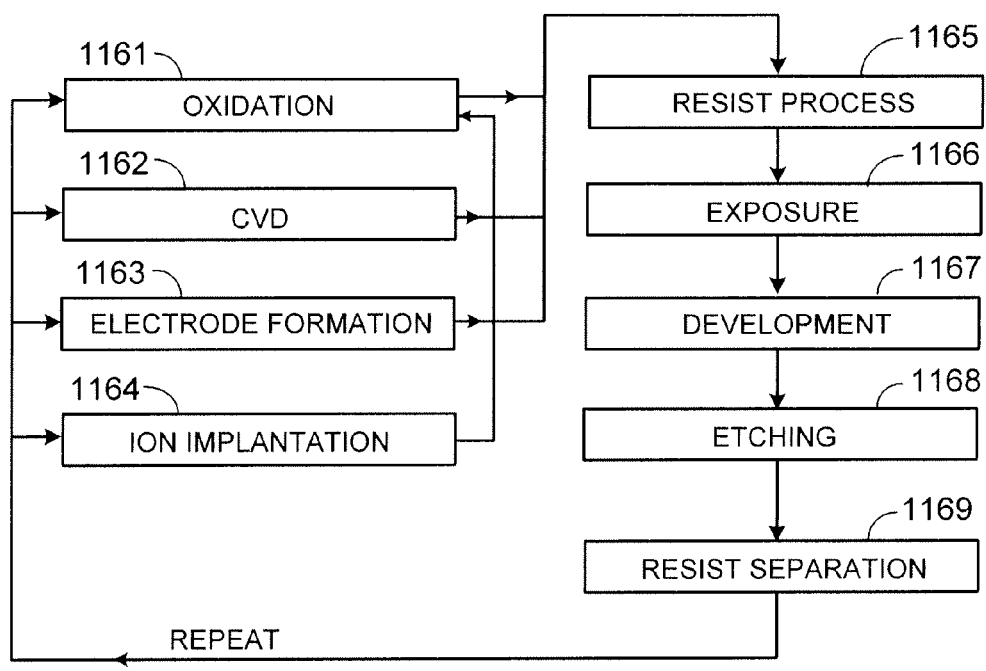
FIG. 10 is a flow chart that describes further steps for making integrated circuits.

FIG. 10 is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 11:
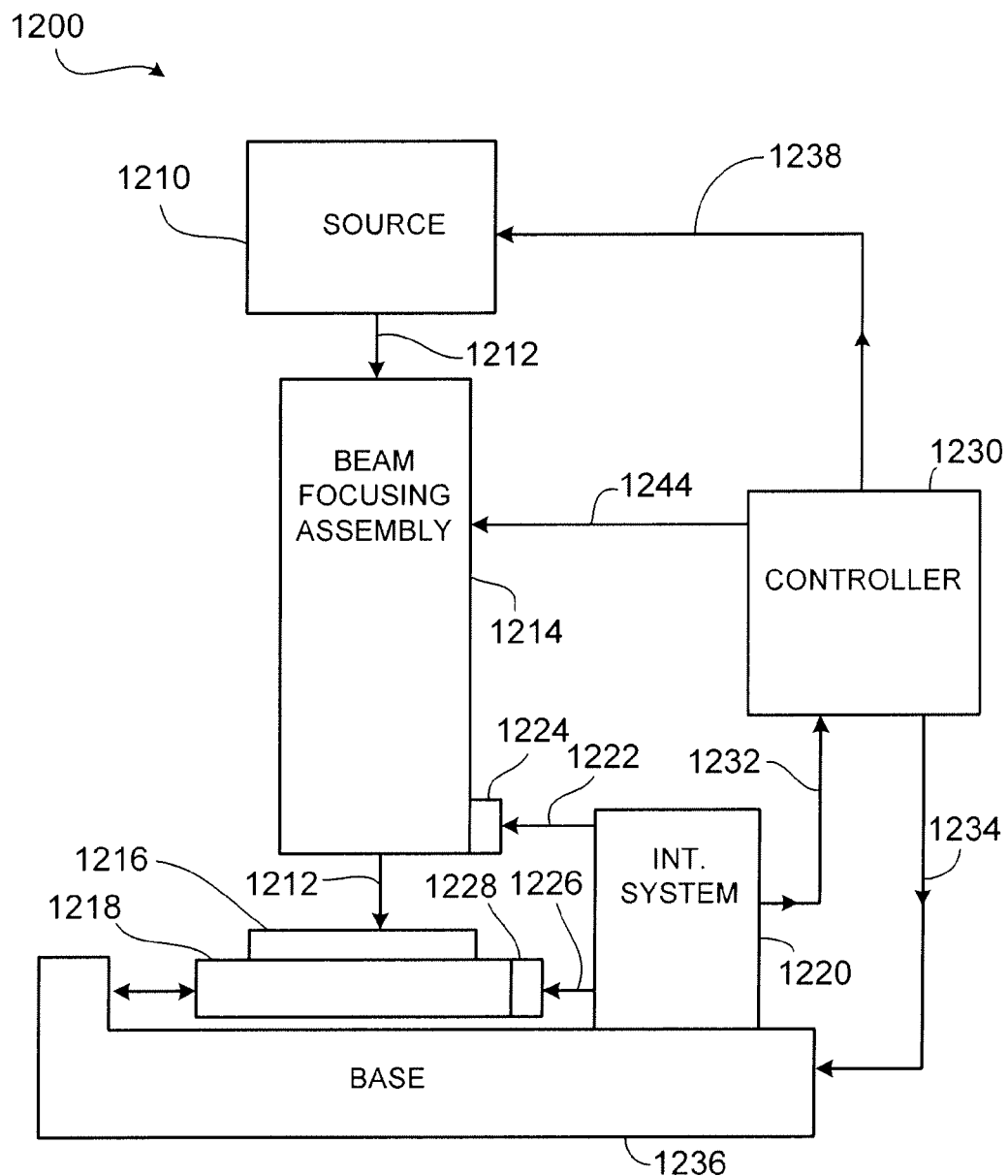
FIG. 11 is a schematic diagram of a beam writing system that includes an interferometry system as described herein.

As an example, a schematic of a beam writing system 1200 is shown in FIG. 11. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrupole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. An acousto-optic modulator, comprising:
   an optical element configured to receive an input optical beam that propagates along a first direction; and
   a transducer extending along the first direction and positioned on one or more surfaces of the optical element, the transducer comprising a transducer material positioned between two electrodes configured to apply a potential difference across the transducer to cause the transducer to generate an acoustic waveform propagating in a second direction in the optical element, the input optical beam undergoing diffraction in a region of the optical element comprising the acoustic waveform,
   wherein the transducer extends along a third direction orthogonal to the first and second directions, and at least one of the transducer material and the electrodes has a maximum length L along the third direction and is shaped so that the acoustic waveform has a reduced phase variation within a central region of length L of the waveform in the third direction, relative to a phase variation within a central region of length L in the third direction of an acoustic waveform generated by a rectangular transducer.

2. The acousto-optic modulator of claim 1, wherein the optical element comprises an optically birefringent material.

3. The acousto-optic modulator of claim 1, wherein the optical element comprises an optically isotropic material.

4. The acousto-optic modulator of claim 1, wherein the transducer material is a piezoelectric material.

5. The acousto-optic modulator of claim 1, wherein a shape of at least one of the electrodes is different from a shape of the transducer material.

6. The acousto-optic modulator of claim 1, wherein at least one of the electrodes comprises at least one material selected from the group consisting of silver, copper, aluminum, and chromium.

7. The acousto-optic modulator of claim 1, wherein the optical element is a prism.

8. The acousto-optic modulator of claim 1, wherein a phase variation of the acoustic waveform within a central region of length L of the waveform along the third direction in an acoustic near-field region of the optical element is less than about 0.005 radian.

9. The acousto-optic modulator of claim 1, wherein a difference between the phase variation within a central region of length L of the acoustic waveform along the third direction, and the phase variation within a central region of length L along the third direction of the acoustic waveform generated by the rectangular transducer, is at least about 0.005 radian.

10. The acousto-optic modulator of claim 1, wherein the transducer comprises a plurality of sub-portions.

11. The acousto-optic modulator of claim 1, wherein the input optical beam propagates through an acoustic near-field region of the optical element.

12. The acousto-optic modulator of claim 1, wherein an intermediate beam is produced from the diffraction of the input optical beam within the optical element.

13. The acousto-optic modulator of claim 12, wherein the intermediate beam comprises two beam components having different frequencies.

14. The acousto-optic modulator of claim 13, wherein the frequency of one of the intermediate beam components is the same as the frequency of the input optical beam.

15. The acousto-optic modulator of claim 12, further comprising:
   a second transducer extending along the first direction and positioned on one or more surfaces of the optical element, the second transducer comprising a second transducer material positioned between a second two electrodes configured to apply a potential difference across the second transducer to cause the second transducer to generate a second acoustic waveform propagating in a fourth direction in the optical element, the intermediate beam undergoing diffraction in a region of the optical element comprising the second acoustic waveform, wherein the second transducer extends along the third direction, and at least one of the second transducer material and the second two electrodes has a maximum length M along the third direction and is shaped so that the second acoustic waveform has a reduced phase variation within a central region of length M of the second acoustic waveform in the third direction, relative to a phase variation in a central region of length M in the third direction of an acoustic waveform generated by a rectangular transducer.

16. The acousto-optic modulator of claim 13, further comprising one or more elements for adjusting a polarization state of each of the intermediate beam components.

17. A system, comprising:
the acousto-optic modulator of claim 1;
a source configured to provide the input optical beam; and
an interferometry system configured to receive one or more output beams from the acousto-optic modulator.

18. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the system of claim 17 wherein the interferometry system is configured to monitor the position of the wafer relative to the imaged radiation.

19. A lithography system for use in fabricating integrated circuits on a wafer, the system comprising:
a stage for supporting the wafer; and
an illumination system including a radiation source, a mask, a positioning system, a lens assembly, and the system of claim 17,
wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

20. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative to one another; and
the system of claim 17 wherein the interferometry system is configured to monitor the position of the stage relative to the beam directing assembly.

21. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using the system of claim 17.

22. A lithography method for use in the fabrication of integrated circuits comprising:
directing input radiation through a mask to produce spatially patterned radiation;
positioning the mask relative to the input radiation;
monitoring the position of the mask relative to the input radiation using the system of claim 17; and
imaging the spatially patterned radiation onto a wafer.

23. A lithography method for fabricating integrated circuits on a wafer comprising:
positioning a first component of a lithography system relative to a second component of a lithography system to expose the wafer to spatially patterned radiation; and
monitoring the position of the first component relative to the second component using the system of claim 17.

24. An acousto-optic modulator, comprising:
an optical element configured to receive an input optical beam that propagates along a first direction; and
a transducer extending along the first direction and positioned on one or more surfaces of the optical element, the transducer comprising a transducer material positioned between two electrodes configured to apply a potential difference across the transducer to cause the transducer to generate an acoustic waveform propagating in a second direction in the optical element, the input optical beam undergoing diffraction in a region of the optical element comprising the acoustic waveform,
wherein the transducer extends along a third direction orthogonal to the first and second directions, and at least one of the transducer material and the electrodes has a maximum length L along the third direction and is shaped so that a phase variation of the acoustic waveform within a central region of length L of the waveform along the third direction is less than about 0.005 radian.

25. An acousto-optic modulator, comprising:
an optical element configured to receive an input optical beam that propagates along a first direction; and
a transducer extending along the first direction and positioned on one or more surfaces of the optical element, the transducer comprising a transducer material positioned between two electrodes configured to apply a potential difference across the transducer to cause the transducer to generate an acoustic waveform propagating in a second direction in the optical element, the input optical beam undergoing diffraction in a region of the optical element comprising the acoustic waveform,
wherein the transducer extends along a third direction orthogonal to the first and second directions, and
wherein the transducer comprises a plurality of sub-portions, each of the sub-portions comprising:
two edges parallel to the third direction and extending along the entire length of the transducer; and
a center of mass,
wherein a position of the center of mass of each of the sub-portions along the first direction is different, and the position of the center of mass of each of the sub-portions along the third direction varies among the sub-portions.

* * * * *

UNITED STATES PATENT AND TRADEMARK OFFICE
CERTIFICATE OF CORRECTION

PATENT NO. : 7,697,195 B2
APPLICATION NO. : 11/753906
DATED : April 13, 2010
INVENTOR(S) : Henry A. Hill It is certified that error appears in the above-identified patent and that said Letters Patent is hereby corrected as shown below:

Column 28
Line 19, replace "clement" with -- element --

Signed and Sealed this

Fifteenth Day of June, 2010

David J. Kappos
*Director of the United States Patent and Trademark Office*